United States Patent
Harai et al.

(10) Patent No.: US 7,367,503 B2
(45) Date of Patent: May 6, 2008

(54) UNIVERSAL NON-VOLATILE MEMORY CARD USED WITH VARIOUS DIFFERENT STANDARD CARDS CONTAINING A MEMORY CONTROLLER

(75) Inventors: Eliyahou Harai, Los Gatos, CA (US); Bo Eric Ericsson, Los Gatos, CA (US); Robert F. Wallace, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 10/293,985

(22) Filed: Nov. 13, 2002

(65) Prior Publication Data

US 2004/0089717 A1     May 13, 2004

(51) Int. Cl.
    *G06K 7/06*     (2006.01)
(52) U.S. Cl. .................... 235/441; 235/492
(58) Field of Classification Search ............. 235/441, 235/486, 492
    See application file for complete search history.

(56) References Cited

U.S. PATENT DOCUMENTS

| | | | |
|---|---|---|---|
| 4,455,620 A | 6/1984 | Watanabe et al. | |
| 4,458,313 A | 7/1984 | Suzuki et al. | |
| 4,614,144 A * | 9/1986 | Sagara et al. | 84/609 |
| 4,882,473 A | 11/1989 | Bergeron et al. | |
| 5,067,075 A | 11/1991 | Sugano et al. | |
| 5,155,663 A | 10/1992 | Harase | |
| 5,375,037 A | 12/1994 | Le Roux | |
| 5,375,084 A | 12/1994 | Begun et al. | |
| 5,434,872 A | 7/1995 | Petersen et al. | |
| 5,438,359 A | 8/1995 | Aoki | |
| 5,457,601 A | 10/1995 | Georgopulos et al. | |
| 5,486,687 A | 1/1996 | Le Roux | |
| 5,513,074 A | 4/1996 | Ainsbury et al. | |
| 5,563,400 A | 10/1996 | Le Roux | |

(Continued)

FOREIGN PATENT DOCUMENTS

DE     44 16 583 C1     12/1995

(Continued)

OTHER PUBLICATIONS

SD Group, "SD Memory Card Specifications, Simplified Version of: Part 1, Physical Layer Specification, Version 1.01," Apr. 15, 2001, 32 pages.

(Continued)

*Primary Examiner*—Seung Ho Lee
(74) *Attorney, Agent, or Firm*—Winston & Strawn LLP

(57) ABSTRACT

A mother/daughter card non-volatile memory system includes a daughter card containing the memory and a mother card containing the memory controller and host interface circuits. The daughter memory card contains as little more than the memory cell array as is practical, in order to minimize its cost, and has an interface for connecting with a variety of mother controller cards having physical attributes and host interfaces according to a number of different published or proprietary memory card standards. Different types of memory cards may be used when the operating parameters of the memory are stored within it in a protected location, the mother card controller then reading these parameters and adapting its operation accordingly. A radio frequency antenna may be included on a surface of the card along with its electrical contacts, in order to provide a radio frequency identification function.

39 Claims, 11 Drawing Sheets

U.S. PATENT DOCUMENTS

| | | |
|---|---|---|
| 5,606,559 A | 2/1997 | Badger et al. |
| 5,655,917 A | 8/1997 | Kaneshige et al. |
| 5,677,524 A | 10/1997 | Haghiri-Tehrani |
| 5,727,168 A | 3/1998 | Inoue et al. |
| 5,733,800 A | 3/1998 | Moden |
| 5,742,910 A * | 4/1998 | Gallant et al. ............... 455/558 |
| 5,752,857 A | 5/1998 | Knights |
| 5,764,896 A | 6/1998 | Johnson |
| 5,780,837 A | 7/1998 | Garcia |
| 5,780,925 A | 7/1998 | Cipolla et al. |
| 5,784,259 A | 7/1998 | Asakura ..................... 361/752 |
| 5,784,633 A | 7/1998 | Petty |
| 5,802,325 A | 9/1998 | Le Roux |
| 5,809,520 A | 9/1998 | Edwards et al. |
| 5,822,190 A | 10/1998 | Iwasaki |
| 5,831,256 A | 11/1998 | De Larminat et al. |
| 5,831,533 A | 11/1998 | Kanno |
| 5,837,984 A | 11/1998 | Bleier et al. |
| 5,852,290 A | 12/1998 | Chaney |
| 5,877,488 A | 3/1999 | Klatt et al. |
| 5,887,145 A | 3/1999 | Harari et al. |
| 5,909,596 A | 6/1999 | Mitzuta |
| 5,928,347 A | 7/1999 | Jones |
| 5,933,328 A | 8/1999 | Wallace et al. |
| 5,974,496 A | 10/1999 | Miller |
| 5,975,584 A * | 11/1999 | Vogt ............................ 283/98 |
| 5,987,557 A | 11/1999 | Ebrahim |
| 6,040,622 A | 3/2000 | Wallace |
| 6,062,480 A | 5/2000 | Evoy |
| 6,062,887 A * | 5/2000 | Schuster et al. ............. 439/218 |
| 6,069,795 A | 5/2000 | Klatt et al. |
| 6,075,706 A * | 6/2000 | Learmonth et al. ......... 361/737 |
| 6,097,605 A | 8/2000 | Klatt et al. |
| 6,125,409 A | 9/2000 | Le Roux |
| 6,137,710 A | 10/2000 | Iwasaki et al. |
| 6,140,695 A | 10/2000 | Tandy |
| 6,145,046 A | 11/2000 | Jones |
| 6,151,511 A | 11/2000 | Cruciani |
| 6,151,652 A | 11/2000 | Kondo et al. |
| 6,175,517 B1 | 1/2001 | Jigour et al. |
| 6,199,756 B1 | 3/2001 | Kondo et al. |
| 6,202,109 B1 | 3/2001 | Salo et al. |
| 6,209,790 B1 | 4/2001 | Houdeau et al. ............ 235/491 |
| 6,226,202 B1 | 5/2001 | Kikuchi |
| 6,240,301 B1* | 5/2001 | Phillips ...................... 455/558 |
| 6,244,894 B1* | 6/2001 | Miyashita ................... 439/500 |
| 6,266,724 B1 | 7/2001 | Harari et al. |
| 6,279,114 B1 | 8/2001 | Toombs et al. |
| 6,311,296 B1 | 10/2001 | Congdon |
| 6,353,870 B1 | 3/2002 | Mills et al. |
| 6,381,662 B1 | 4/2002 | Harari et al. |
| 6,385,677 B1 | 5/2002 | Yao |
| 6,405,278 B1 | 6/2002 | Liepe |
| 6,421,246 B1* | 7/2002 | Schremmer ................. 361/737 |
| 6,434,648 B1 | 8/2002 | Assour et al. |
| 6,438,638 B1* | 8/2002 | Jones et al. ................. 710/301 |
| 6,446,177 B1 | 9/2002 | Tanaka et al. |
| 6,457,647 B1 | 10/2002 | Kurihashi et al. |
| 6,496,381 B1 | 12/2002 | Groeger |
| 6,499,016 B1 | 12/2002 | Anderson |
| 6,524,137 B1* | 2/2003 | Liu et al. .................... 439/638 |
| 6,612,498 B1* | 9/2003 | Lipponen et al. ........... 235/486 |
| 6,651,131 B1 | 11/2003 | Chong, Jr. et al. |
| 6,665,190 B2 | 12/2003 | Clayton et al. |
| 6,669,487 B1 | 12/2003 | Nishizawa et al. |
| 6,676,420 B1 | 1/2004 | Liu et al. |
| 6,745,247 B1 | 6/2004 | Kawan et al. |
| 6,748,457 B2 | 6/2004 | Fallon et al. |
| 6,764,017 B2 | 7/2004 | Chen et al. |
| 6,764,346 B2* | 7/2004 | Fujita et al. ................ 439/638 |
| 6,816,933 B1 | 11/2004 | Andreas |
| 6,832,281 B2 | 12/2004 | Jones et al. |
| 6,845,421 B2 | 1/2005 | Hwang et al. |
| 6,862,604 B1 | 3/2005 | Spencer et al. |
| 6,886,083 B2* | 4/2005 | Murakami .................. 711/156 |
| 6,945,461 B1* | 9/2005 | Hien et al. .................. 235/451 |
| 2001/0001507 A1* | 5/2001 | Fukuda et al. .............. 257/778 |
| 2001/0021956 A1 | 9/2001 | Okamoto et al. |
| 2001/0042149 A1 | 11/2001 | Ito et al. |
| 2002/0032059 A1 | 3/2002 | Sugimura .................... 463/43 |
| 2002/0103988 A1 | 8/2002 | Dornier |
| 2002/0154543 A1 | 10/2002 | Conley et al. ......... 365/185.11 |
| 2003/0056050 A1 | 3/2003 | Moro |
| 2003/0074529 A1 | 4/2003 | Crohas |
| 2003/0084221 A1 | 5/2003 | Jones et al. |
| 2003/0163623 A1 | 8/2003 | Yeung |
| 2004/0103234 A1 | 5/2004 | Zer et al. |
| 2004/0201745 A1 | 10/2004 | Wess et al. |
| 2005/0107987 A1 | 5/2005 | Barr et al. |

FOREIGN PATENT DOCUMENTS

| | | |
|---|---|---|
| DE | 198 55 596 A | 6/2000 |
| EP | 0495216 A2 | 12/1991 |
| EP | 9301540 | 4/1995 |
| EP | 0657834 A1 | 6/1995 |
| EP | 4416583 | 12/1995 |
| EP | 0891047 A2 | 1/1999 |
| EP | 2771199 | 5/1999 |
| EP | 1 001 348 | 5/2000 |
| EP | 1037159 | 9/2000 |
| EP | 1037159 A | 9/2000 |
| EP | 1074906 A1 | 2/2001 |
| EP | 1085516 A2 | 3/2001 |
| EP | 1278154 A1 | 1/2003 |
| FR | 2771199 A | 5/1999 |
| GB | 2374204 A * | 10/2002 |
| JP | 60234286 | 11/1985 |
| JP | 3195052 | 8/1991 |
| JP | 5089304 | 4/1993 |
| JP | 6103429 | 4/1994 |
| JP | 6223241 | 8/1994 |
| JP | 6231318 | 8/1994 |
| JP | 7094658 | 4/1995 |
| JP | 2001282712 | 10/2001 |
| JP | 2001-307801 | 11/2001 |
| JP | 2002245428 | 8/2002 |
| JP | 2003-76611 A | 3/2003 |
| JP | 2003196624 | 7/2003 |
| NL | 9301540 A | 4/1995 |
| TW | 471729 | 1/2002 |
| TW | 483547 | 4/2002 |
| TW | 486120 | 5/2002 |
| TW | 490889 | 6/2002 |
| TW | 499002 | 8/2002 |
| WO | 00/70553 | 11/2000 |
| WO | 00/70554 | 11/2000 |
| WO | 01/84490 A1 | 11/2001 |
| WO | 02/013021 A3 | 2/2002 |
| WO | 02/15020 A2 | 2/2002 |
| WO | WO 02/13021 | 2/2002 |
| WO | 02/19266 | 3/2002 |
| WO | 2004/044755 A2 | 5/2004 |
| WO | 2004/049177 | 6/2004 |
| WO | WO 2004/095365 A1 | 11/2004 |

OTHER PUBLICATIONS

ETSI, "Digital Cellular Telecommunications System (Phase 2+); Specification of the Subscriber Identity Module—Mobile Equipment (SIM—ME) Interface," GSM 11.11 Version 8.3.0 Release 1999, ETSI TS 100 977 V8.3.0 (Aug. 2000), pp. 1-170.

"Identification Cards—Integrated Circuit(s), Cards With Contacts; Part 1: Physical Characteristics," International Standard, ISO/IEC 7816-1, Oct. 15, 1998, 8 pages.

"Information Technology—Identification Cards—Integrated Circuit(s) Cards With Contacts; Part 3: Electronic Signals and Transmission Protocols," International Standard, ISO/IEC 7816-3, Dec. 15, 1997, 32 pages.

"Identification Cards—Integrated Circuit(s) Cards With Contacts; Part 10: Electronic Signals and Answer to Reset for Synchronous Cards," International Standard, ISO/IEC 7816-10, Nov. 1, 1999, 13 pages.

"Information Technology—Identification Cards—Integrated Circuit(s) Cards With Contacts; Part 2: Dimensions and Location of the Contacts," International Standard, ISO/IEC 7816-2, Mar. 1, 1999, 10 pages.

CompactFlash Association, "CF+ and CompactFlash Specification Revision 1.4", Jul. 1999, pp. 1-105.

MMCA Technical Committee, "The MultiMediaCard System Specification, Version 3.1", Jun. 2001, pp. 1-130.

"Olympus Camedia; Accessories At a Glance", http://www.bicos.de/media/Olympus-Zubeh%F6r.pdf, Sep. 9, 2002, 18 pages.

"Communication Relating to the Results of the Partial International Search", European Patent Office, International Searching Authority, related to corresponding application PCT/US03/35325, Jul. 2, 2004, 6 pages.

SanDisk Corporation, "MultiMediaCard Product Manual", Revision 2, Apr. 2000, pp. 1-86.

International Standard, "Identification Cards—Physical Characteristics", ISO/IEC 7810, Second Edition, Aug. 15, 1995, pp. 1-5.

European Patent Office, International Searching Authority, "Partial International Search", from related PCT/US2004/007782, dated Oct. 8, 2004, 4 pages.

EPO/ISA, "International Search Report", mailed in corresponding PCT/US03/35325 on Oct. 13, 2004, 9 pages.

EPO/ISA, "International Search Report and Written Opinion of the International Searching Authority", mailed in related PCT/US2004/007782 on Oct. 13, 2004, 15 pages.

Wilson, James Y. and Kronz, Jason A., "Inside Bluetooth—Part 1," *Dr. Dobb's Journal*, pp. 62-70, Mar. 2000.

Wilson, James Y. and Kronz, Jason A., "Inside Bluetooth—Part 2," *Dr. Dobb's Journal*, pp. 58-64, Apr. 2000.

MultiMediaCard System Specification Version 2.2 Official Release © Jan. 2000 MMCA Technical Committee, pp. 2-123.

MultiMediaCard System Specifications Version 2.11 Official Release © Jun. 1999 MMCA Technical Committee, pp. 2-123.

Taiwanese Patent Office, "Final Office Action Prior to Rejection", issued in Taiwan Patent Application No. 90121510, received by facsimile Jun. 23, 2005, (2 pages).

EPO/ISA, "Notification of Transmittal of the International Search Report and the Written Opinion of the International Searching Authority, or the Declaration," mailed in PCT/US2004/040122 on Apr. 1, 2005 (11 pages).

MultiMediaCard System Specification Version 3.1 Office Release (c) Jun. 2001 MMCA Technical Committee, pp. 2-123.

EPO/ISA, "Notification of the International Search Report or the Declaration," mailed Feb. 11, 2004 in PCT/US03/40042, 7 pages.

"Palm Brand Products to Feature Secure Digital (SD) Card Slot for Expansion", SD Card Association—Press Room, www.sdcard.org/press7.htm, dated Jun. 27, 2000, 4 pages.

EPO/ISA, "International Search Report" mailed in PCT/US01/27362 on Feb. 25, 2002, 3 pages.

Chinese Patent Office, Notification of the First Office Action, mailed Apr. 16, 2004 in Chinese application No. 01815704.1 (10 pages, including translation).

U.S. Office Action for Application No. 10/302,009, mailed Sep. 6, 2005, 17 pages.

International Search Report and Written Opinion issued in PCT/US2004/040952, mailed Apr. 29, 2005, (11 pages).

"Palm Brand Products to Feature Secure Digital (SD) Card Slot for Expansion", SD Card Association, N.Y. 2001, www.sdcard.org/press7.html (4 pages).

U.S. Office Action for U.S. Appl. No. 10/418,910, mailed Oct. 14, 2005, 17 pages.

European Office Action, 03 783 177.3, mailed Sep. 14, 2005, 4 pages.

Official Notification of the IPO, 093138176, mailed Oct. 5, 2005, 2 pages.

U.S. Office Action for U.S. Appl. No. 10/741,147, mailed Nov. 23, 2005, 25 pages.

U.S. Office for U.S. Appl. No. 11/075,438, mailed Jan. 24, 2006, 9 pages.

PCT/International Bureau, International Preliminary Exam Report, PCT/US2004/007782, dated Nov. 3, 2005, 11 pages.

Taiwanese Patent Office, "Preliminary Notice Of Rejection From IPO", issued in Taiwan Patent Application No. 093139258, received by facsimile Mar. 17, 2006, (2 pages).

U.S. Office Action for U.S. Appl. No. 11/303,220, mailed Mar. 10, 2006, 19 pages.

European Office Action for European Patent Application No. 04 719 867.6, mailed Mar. 22, 2006, 3 pages.

U.S. Office Action for U.S. Appl. No. 10/732,149, mailed Feb. 14, 2006, 32 pages.

Olympus, Internet, XP002282218 CAMEDIA; Accessories at a glance Retrieved from the Internet: URL: http://www.bicos.de/media/Olympus-Zubeh%F6r.pdf>, retrieved on May 26, 2004.

USPTO, Office Action mailed in related U.S. Appl. No. 11/461,063 on Jul. 23, 2007, 14 pages.

Text of First Office Action of China State mailed in corresponding Chinese Application No. 200380107342.3 on Jun. 22, 2007, 18 pgs.

Taiwanese Patent Office, Office Action mailed in corresponding Application No. 92131414 on Jun. 12, 2007, 7 pages.

Chinese Patent Office, Board's Decision mailed in related Chinese Application No. 018157041.1 on Mar. 5, 2007, 2 pages.

Decision of Rejection mailed in Taiwan Patent Application No.: 90121510 on Jul. 7, 2003, 4 pages.

European Patent Office/International Searching Authority, Notification of Transmittal of International Preliminary Examination Report mailed in International Application No. PCT/US01/27362 on Jul. 1, 2002, 3 pages.

European Patent Office, extended European Search Report mailed in corresponding European Application No. EP 06 02 3700, 13 pages.

European Patent Office, Decision to Grant, mailed in European Application No. 03 783 177.3 on Jul. 5, 2007, 1 page.

Allowance Decision of Examination in Taiwanese Application No. 94132884, Aug. 15, 2007, 2 pages (translation not available).

\* cited by examiner

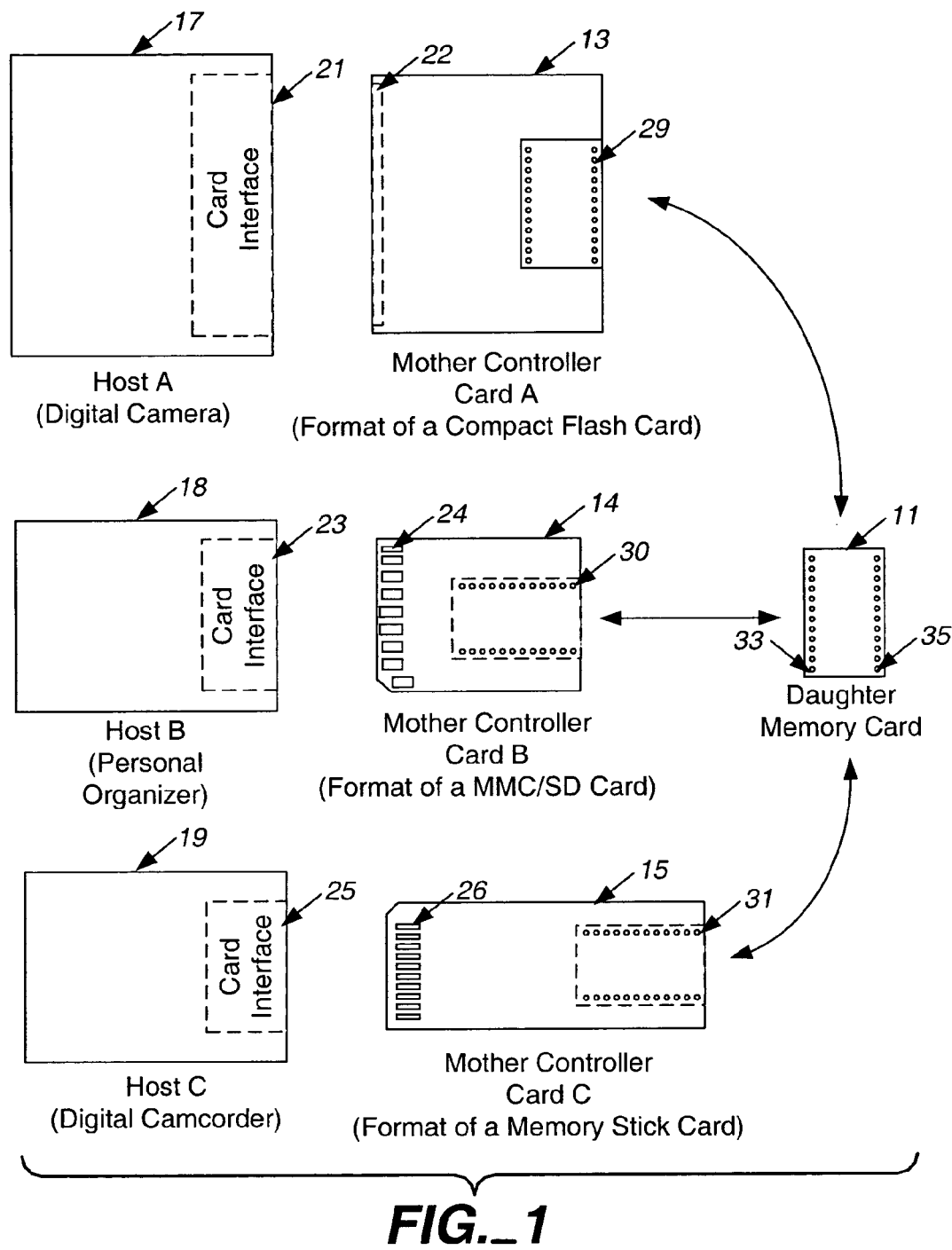
FIG._1

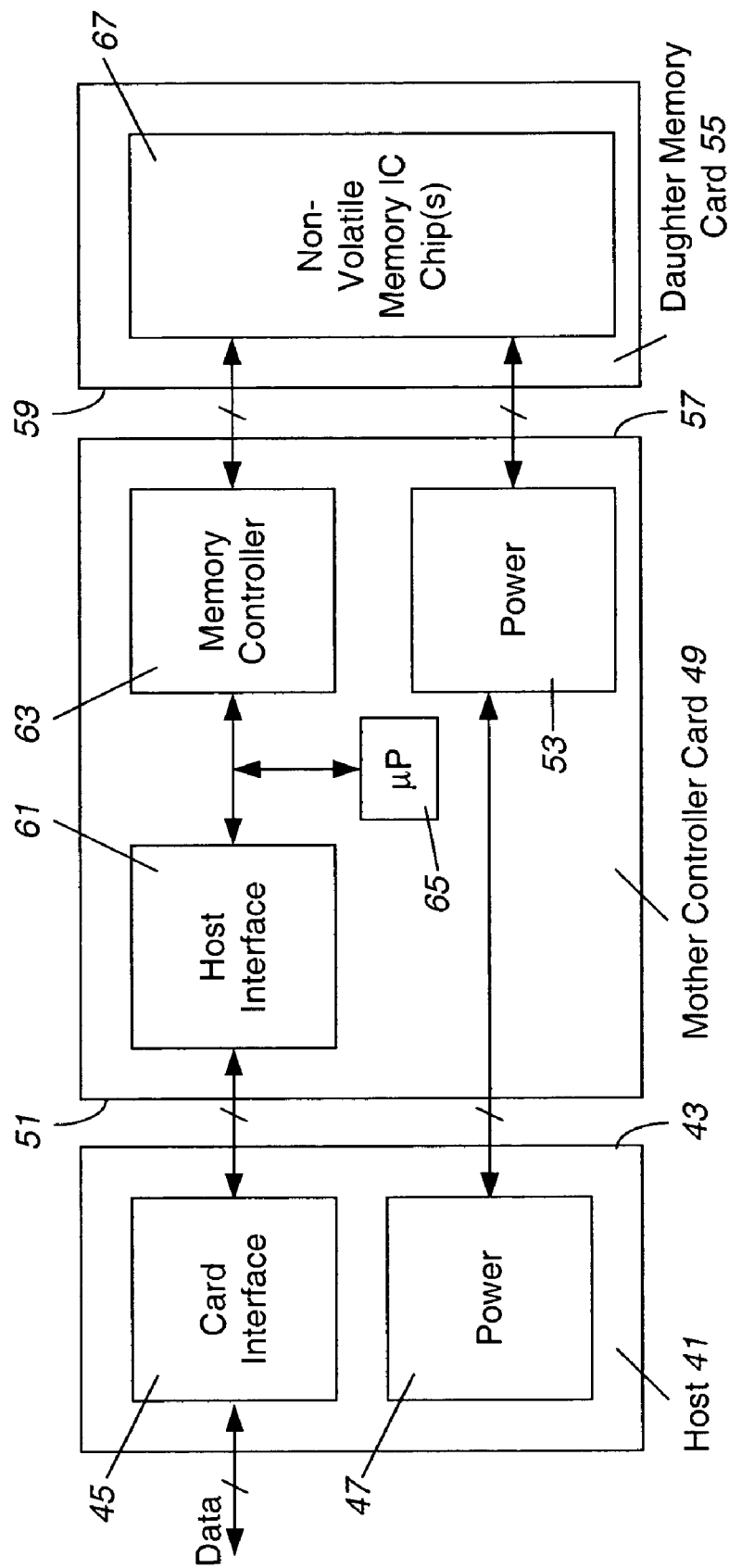
FIG._2

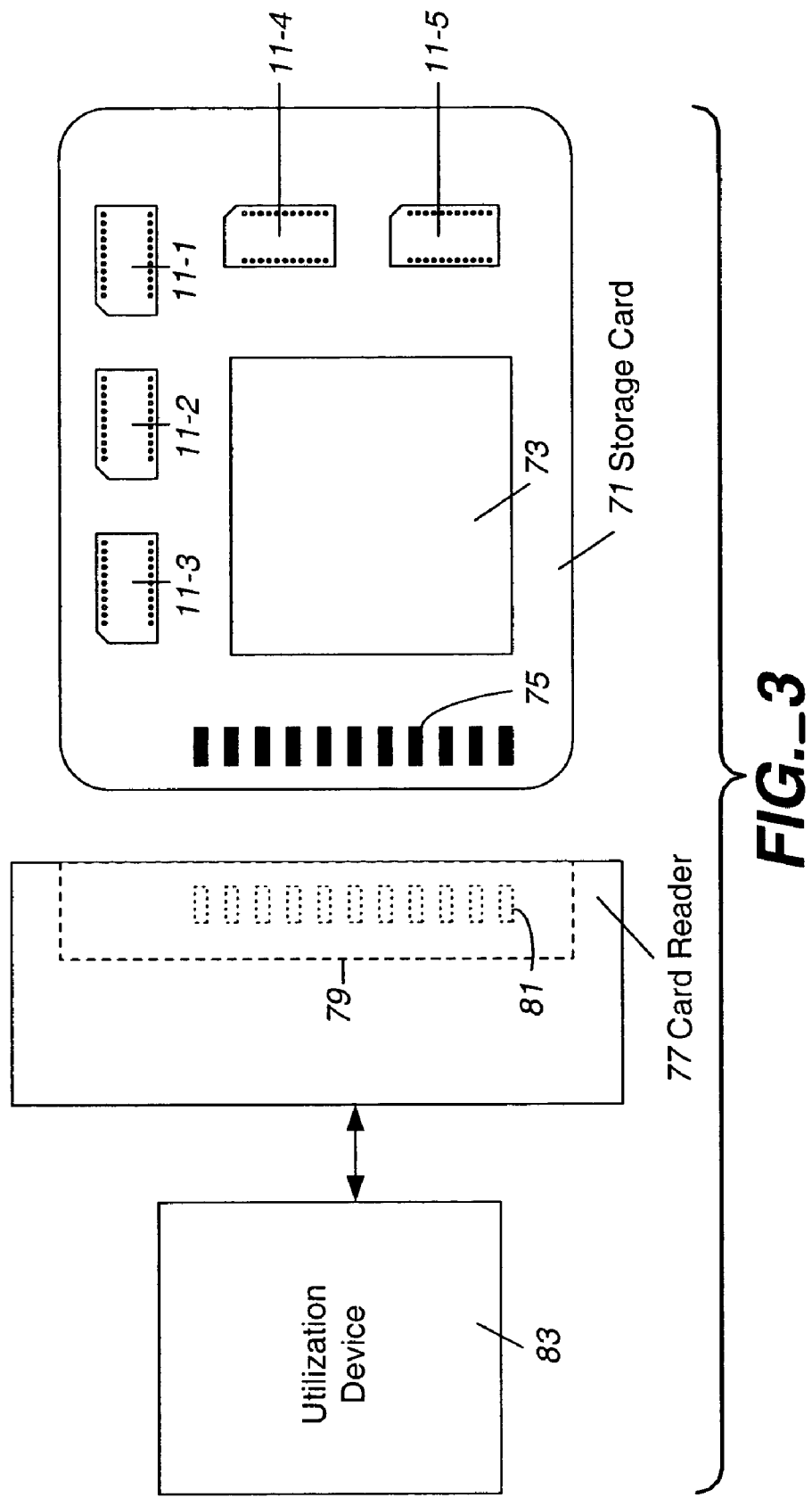
FIG._3

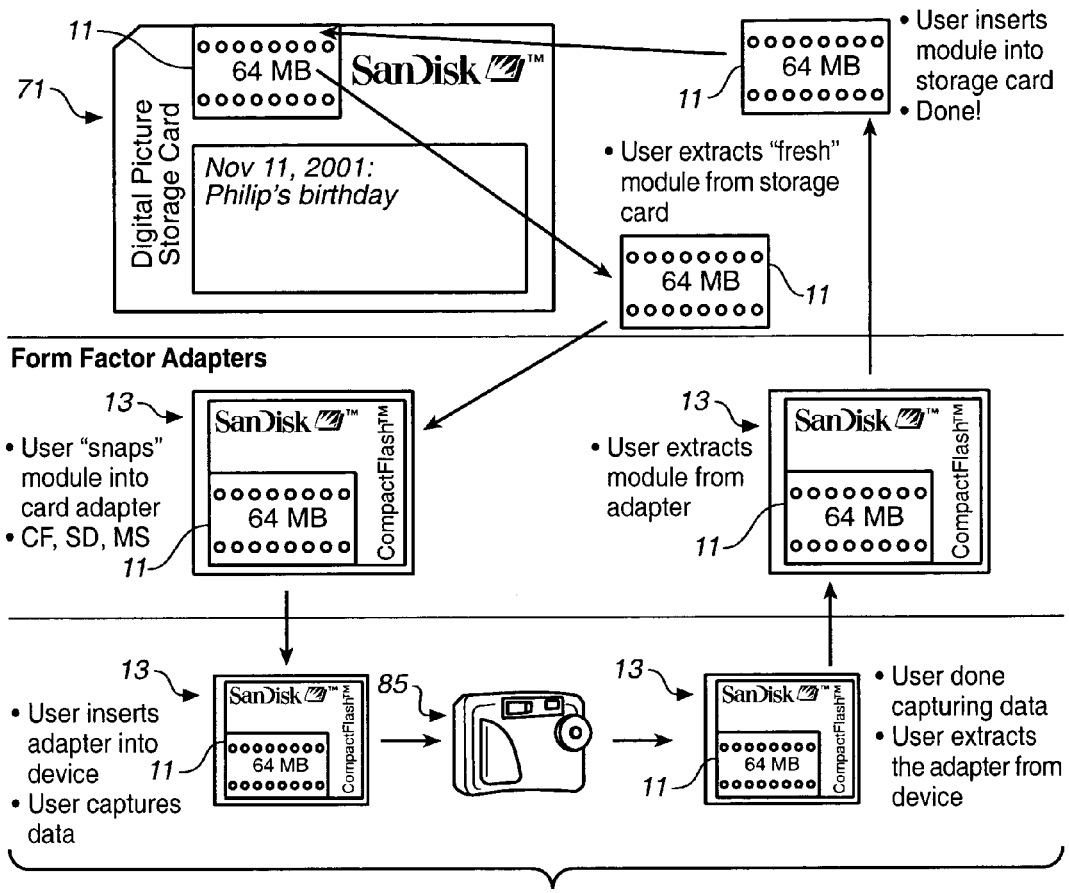
FIG._4
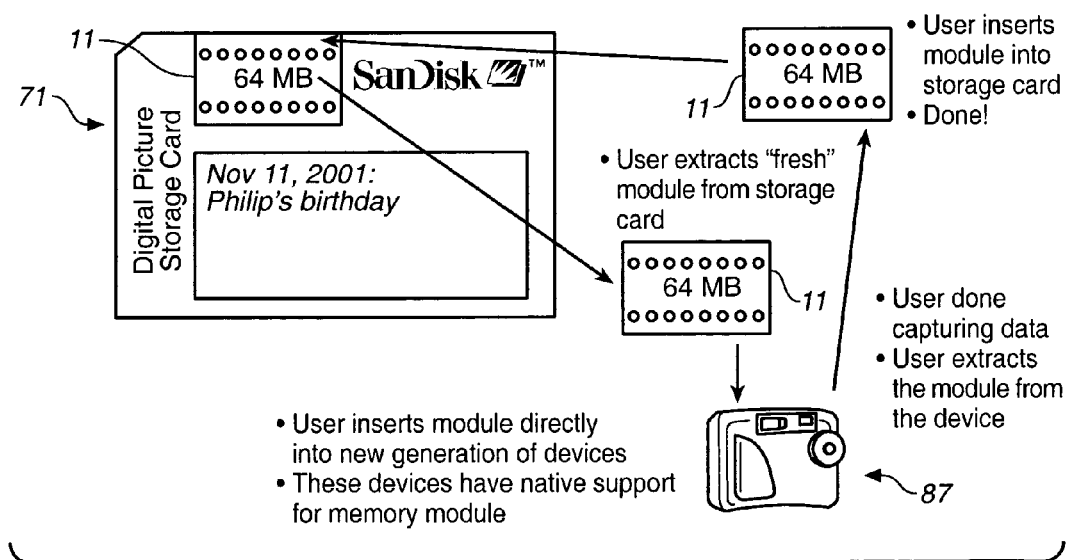
FIG._5

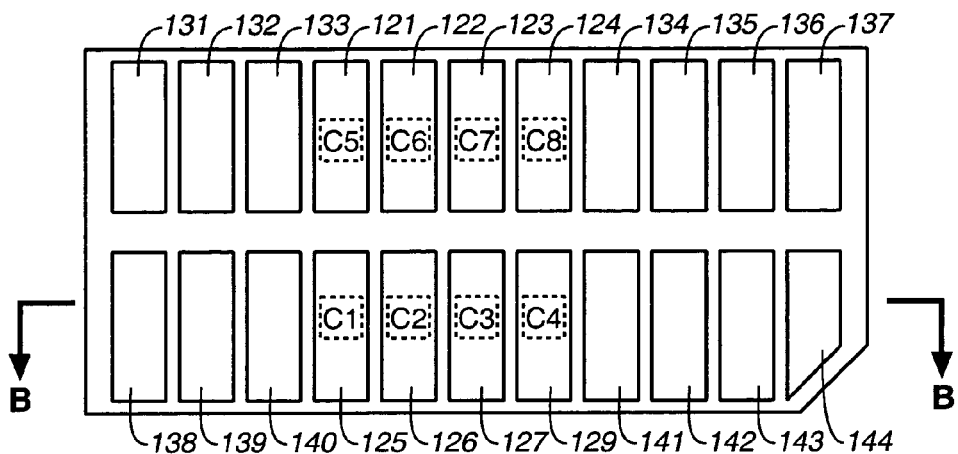
FIG._6A
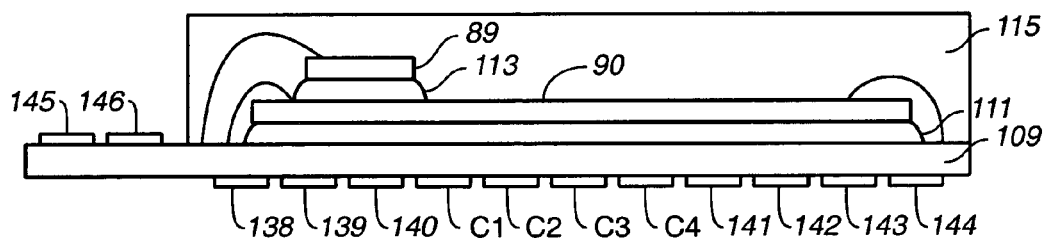
FIG._6B
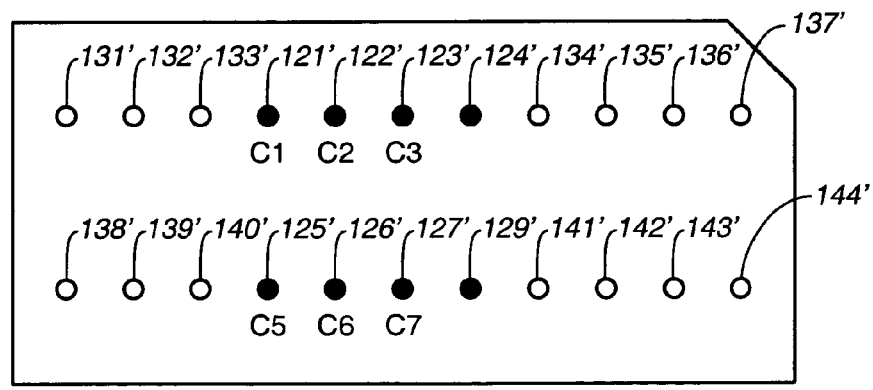
FIG._7

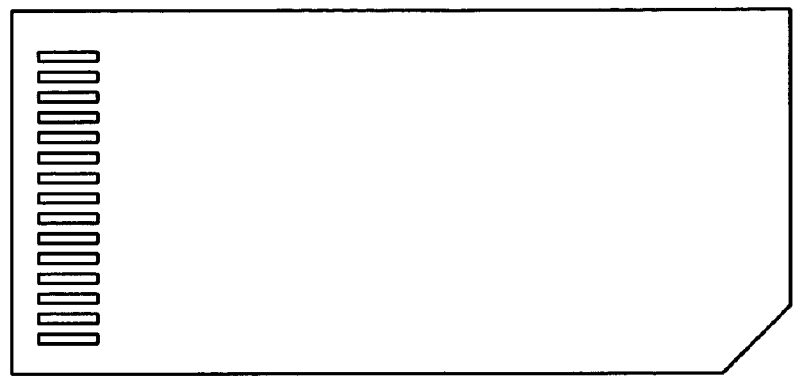
FIG._9
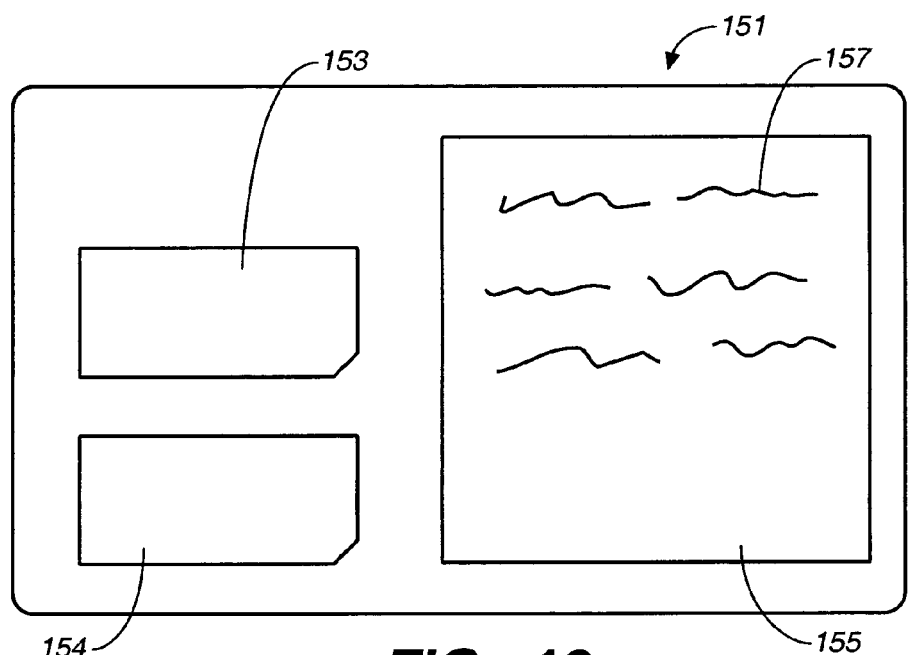
FIG._13
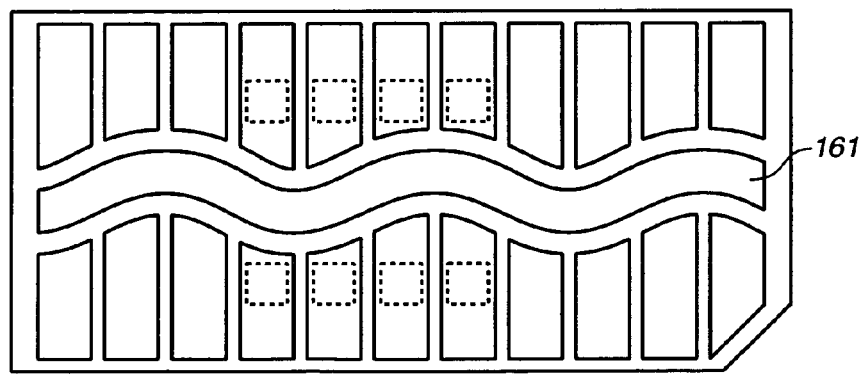
FIG._14

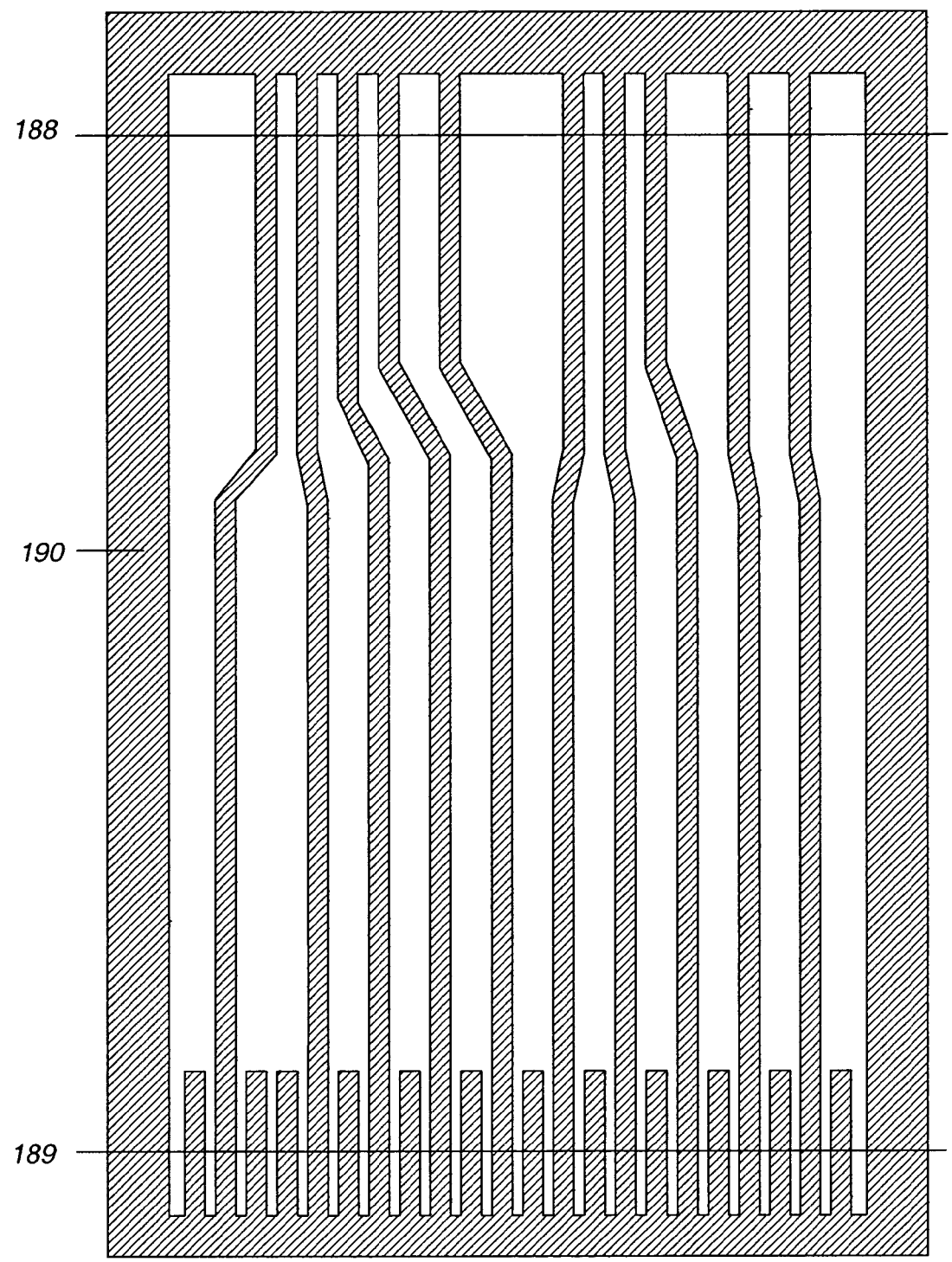
FIG._10

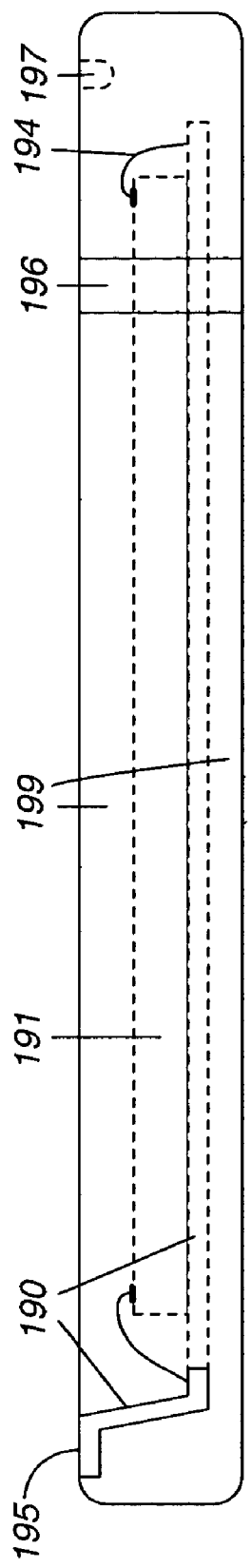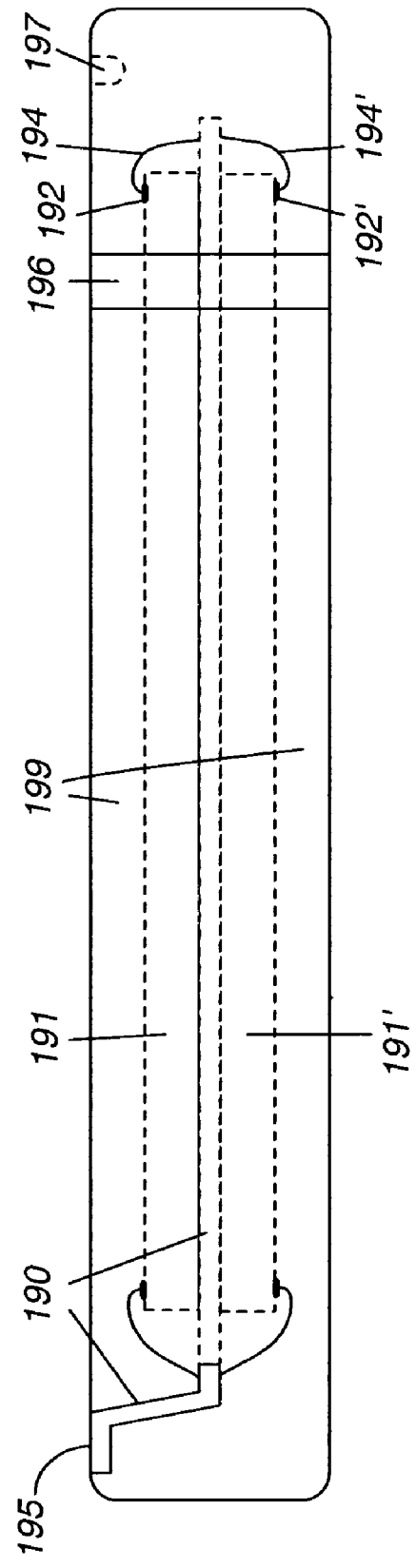

FIG._12A
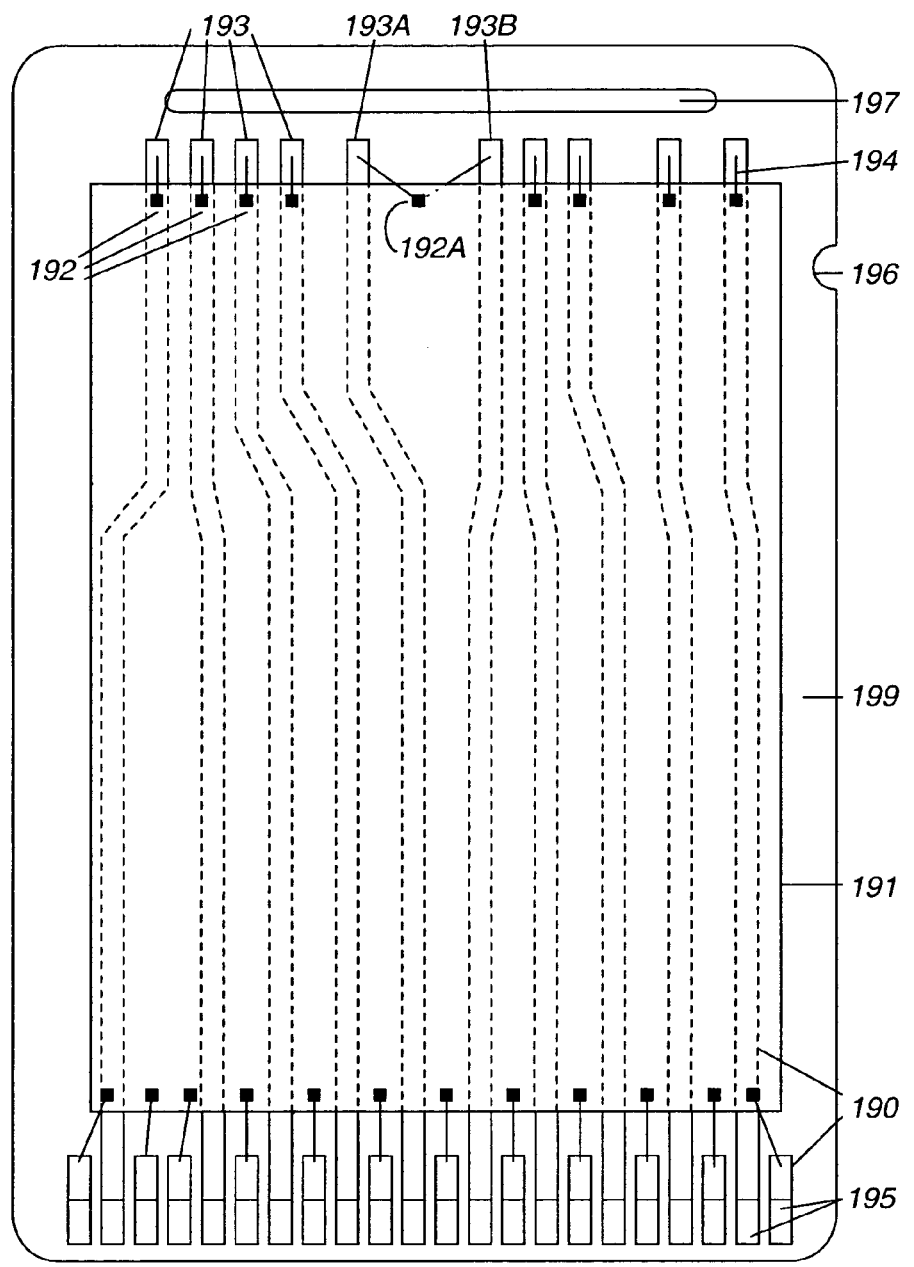
FIG._12B
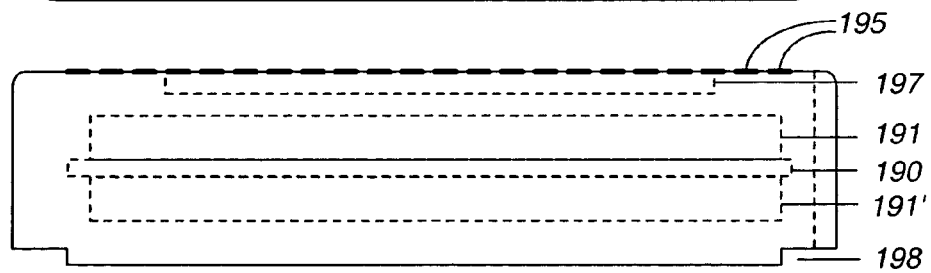

UNIVERSAL NON-VOLATILE MEMORY CARD USED WITH VARIOUS DIFFERENT STANDARD CARDS CONTAINING A MEMORY CONTROLLER

FIELD OF THE INVENTION

This invention relates generally to the use and structure of removable electronic circuit cards having different mechanical and/or electrical interfaces, particularly those including mass non-volatile integrated circuit memory.

BACKGROUND OF THE INVENTION

Electronic circuit cards, including non-volatile memory cards, have been commercially implemented according to a number of well-known standards. Memory cards are used with personal computers, cellular telephones, personal digital assistants, digital cameras, portable audio players and other host electronic devices for the storage of large amounts of data. Such cards usually contain a non-volatile semiconductor memory cell array along with a controller that controls operation of the memory cell array and interfaces with a host to which the card connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard.

One such standard, the PC Card Standard, provides specifications for three types of PC Cards. Originally released in 1990, the PC Card Standard now contemplates three forms of a rectangular card measuring 85.6 mm. by 54.0 mm., having thicknesses of 3.3 mm. (Type I), 5.0 mm. (Type II) and 10.5 mm. (Type III). An electrical connector, which engages pins of a slot in which the card is removably inserted, is provided along a narrow edge of the card. PC Card slots are included in current notebook personal computers, as well as in other host equipment, particularly portable devices. The PC Card Standard is a product of the Personal Computer Memory Card International Association (PCMCIA). The latest release of the PC Card Standard from the PCMCIA is dated February 1995, which standard is incorporated herein by this reference.

In 1994, SanDisk Corporation introduced the Compact-Flash™ card (CF™ card) that is functionally compatible with the PC Card but is much smaller. The CF™ card is rectangularly shaped with dimensions of 43 mm. by 36 mm. and a thickness of 3.3 mm., and has a female pin connector along one edge. The CF™ card is widely used with cameras for the storage of video data. A passive adapter card is available, in which the CF™ card fits, that then can be inserted into a PC Card slot of a host computer or other device. The controller within the CF™ card operates with the card's flash memory to provide an ATA interface at its connector. That is, a host with which a CF™ card is connected interfaces with the card as if it is a disk drive. Specifications for the card have been developed by the CompactFlash Association, a current version of these specifications being 1.4, which standard is incorporated herein by this reference.

The SmartMedia™ card is about one-third the size of a PC Card, having dimensions of 45.0 mm. by 37.0 mm. and is very thin at only 0.76 mm. thick. Contacts are provided in a defined pattern as areas on a surface of the card. Its specifications have been defined by the Solid State Floppy Disk Card (SSFDC) Forum, which began in 1996. It contains flash memory, particularly of the NAND type. The SmartMedia™ card is intended for use with portable electronic devices, particularly cameras and audio devices, for storing large amounts of data. A memory controller is included either in the host device or in an adapter card in another format such as one according to the PC Card standard. Physical and electrical specifications for the SmartMedia™ card have been issued by the SSFDC Forum, a current version of this standard being 1.0, which standard is incorporated herein by this reference.

Another non-volatile memory card is the MultiMediaCard (MMC™). The physical and electrical specifications for the MMC™ are given in "The MultiMediaCard System Specification" that is updated and published from time-to-time by the MultiMediaCard Association (MMCA). Version 3.1 of that Specification, dated June 2001, is expressly incorporated herein by this reference. MMC™ products having varying storage capacity up to 128 megabytes in a single card are currently available from SanDisk Corporation. The MMC™ card is rectangularly shaped with a size similar to that of a postage stamp. The card's dimensions are 32.0 mm. by 24.0 mm. and 1.4 mm. thick, with a row of electrical contacts on a surface of the card along a narrow edge that also contains a cut-off corner. These products are described in a "MultiMediaCard Product Manual," Revision 2, dated April 2000, published by SanDisk Corporation, which Manual is expressly incorporated herein by this reference. Certain aspects of the electrical operation of the MMC™ products are also described in U.S. Pat. No. 6,279,114 and in patent application Ser. No. 09/186,064, filed Nov. 4, 1998, both by applicants Thomas N. Toombs and Micky Holtzman, and assigned to SanDisk Corporation. The physical card structure and a method of manufacturing it are described in U.S. Pat. No. 6,040,622, assigned to SanDisk Corporation. Both of these patents and patent application are expressly incorporated herein by this reference.

A modified version of the MMC™ card is the later Secure Digital (SD) card. The SD Card has the same rectangular size as the MMC™ card but with an increased thickness (2.1 mm.) in order to accommodate an additional memory chip when that is desired. A primary difference between these two cards is the inclusion in the SD card of security features for its use to store proprietary data such as that of music. Another difference between them is that the SD Card includes additional data contacts in order to enable faster data transfer between the card and a host. The other contacts of the SD Card are the same as those of the MMC™ card in order that sockets designed to accept the SD Card can also be made to accept the MMC™ card. This is described in patent application Ser. No. 09/641,023, filed by Cedar et al. on Aug. 17, 2000, which application is incorporated herein by this reference. The electrical interface with the SD card is further made to be, for the most part, backward compatible with the MMC™ card, in order that few changes to the operation of the host need be made in order to accommodate both types of cards. Specifications for the SD card are available to member companies from the SD Association (SDA).

Another type of memory card is the Subscriber Identity Module (SIM), the specifications of which are published by the European Telecommunications Standards Institute (ETSI). A portion of these specifications appear as GSM 11.11, a recent version being technical specification ETSI TS 100 977 V8.3.0 (2000-08), entitled "Digital Cellular Telecommunications System (Phase 2+); Specification of the Subscriber Identity Module-Mobile Equipment (SIM-ME) Interface," (GSM 11.11 Version 8.3.0 Release 1999). This specification is hereby incorporated herein by this reference. Two types of SIM cards are specified: ID-1 SIM and Plug-in SIM.

The ID-1 SIM card has a format and layout according to the ISO/IEC 7810 and 7816 standards of the International Organization for Standardizaton (ISO) and the International Electrotechnical Commission (IEC). The ISO/IEC 7810 standard is entitled "Identification cards—Physical characteristics," second edition, August 1995. The ISO/IEC 7816 standard has the general title of "Identification cards—Integrated Circuit(s) Cards with Contacts," and consists of parts 1-10 that carry individual dates from 1994 through 2000. These standards, copies of which are available from the ISO/IEC in Geneva, Switzerland, are expressly incorporated herein by this reference. The ID-1 SIM card is generally the size of a credit card, having dimensions of 85.60 mm. by 53.98 mm., with rounder corners, and a thickness of 0.76 mm. Such a card may have only memory or may also include a microprocessor, the latter often being referred to as a "Smart Card." One application of a Smart Card is as a debit card where an initial credit balance is decreased every time it is used to purchase a product or a service.

The Plug-in SIM is a very small card, smaller than the MMC™ and SD cards. The GSM 11.11 specification referenced above calls for this card to be a rectangle 25 mm. by 15 mm., with one corner cut off for orientation, and with the same thickness as the ID-1 SIM card. A primary use of the Plug-in SIM card is in mobile telephones and other devices for security against the theft and/or unauthorized use of the devices, in which case the card stores a security code personal to the device's owner or user. In both types of SIM cards, eight electrical contacts (but with as few as five being used) are specified in the ISO/IEC 7816 standard to be arranged on a surface of the card for contact by a host receptacle.

Sony Corporation developed a non-volatile memory card, sold as the Memory Stick™, that has yet another set of specifications. Its shape is that of an elongated rectangle having electrical contacts on a surface adjacent one of its short sides. The electrical interface through these contacts with a host to which it is connected is unique.

As is apparent from the foregoing summary of the primary electronic card standards, there are many differences in their physical characteristics including size and shape, in the number, arrangement and structure of electrical contacts and in the electrical interface with a host system through those contacts when the card is inserted into the host card slot. Electronic devices that use electronic cards are usually made to work with only one type of card. Adaptors, both active and passive types, have been provided or proposed to allow some degree of interchangeability of electronic cards among such host devices. U.S. Pat. No. 6,266,724 of Harari et al. describes use of combinations of mother and daughter memory cards, which patent is incorporated herein in its entirety by this reference.

SUMMARY OF THE INVENTION

According to a primary aspect of the present invention, a very small (less than the size of a postage stamp) sub-card or daughter card containing non-volatile memory is removably connectable with one or more electronic cards or mother cards made according to different specifications, such as those of two or more of the above-described incompatible standards, while memory control and unique host interface functions remain on the mother cards. The mother cards individually interface, both mechanically and electrically, with host devices in the same manner as previously. But the non-volatile memory of each type of mother card has been removed and a standard memory interface substituted on the mother card. A universal memory daughter card is removably connectable with any of several different types of mother cards through the standard memory card interface. An advantage of the universal memory card is its reduced size and cost since the memory controller and host interface electronics reside on the mother cards. Since primarily only the memory storage cells are included on the memory card, its cost can be significantly lower than the memory cards described above that each also contain the memory controller and host interface. This standard memory interface between mother card and daughter card is to be distinguished from the host interface between the mother card and the host. While various adaptors may now be used to allow otherwise incompatible memory cards to communicate with a variety hosts, the subject of this aspect of the present invention is the mother/daughter card interface using a standardized universal interface.

According to another aspect of the present invention, such daughter memory cards may be removably carried by a larger substrate (such as one the size of a credit card) for distributing, handling and/or storing, and accessing the very small memory daughter cards. Because of their relatively low cost, the memory cards can be used for permanent storage of data. Video data, such as photographs, and audio data, such as music, are examples of the use of such memory cards by individuals. A storage card preferably carries one or more such memory cards and includes a surface area for the user to write by hand or otherwise uniquely identify or maintain a record of the data content of the memory card(s) attached to it. The memory cards may be distributed and sold through retail channels by selling the storage cards with one or more memory cards attached to each. The storage card may optionally include electrical contacts to which contacts of the attached memory card are connected through the storage card for the purpose of reading the data stored on the memory card, such as by inserting the storage card into a reader connected with a personal computer in the home or office, without having to remove the memory card from the storage card. Alternatively, the storage card may be sized according to the standards for a popular one of the cards described above, such as the Smart Card (ID-1 SIM), with the memory card having a pattern of contacts and position on the storage card according to that same standard, thereby allowing the storage card with an attached memory card to be inserted into existing or suitably adapted card readers and read through the memory card contacts. Further contacts need not be provided on the storage card in order to access the memory card.

Additionally, the storage card for daughter memory cards may be provided with an intelligent controller capable of communicating with existing memory card readers using a variety of existing formats as outlined above for the mother cards. This controller may even communicate using the popular USB protocol in which case the storage card becomes functionally equivalent to the combination of a mother card and a reader and may plug into a passive adaptor meeting the mechanical standards for a USB connector.

In yet another variation, the identity of the daughter card(s) contained on the storage card may be read out using a contactless RF Identification mode. Suitable RF circuitry may be included either on the daughter card itself or on the storage card. In either case the power required to read out data contained in a predefined portion of the daughter card is provided by the incoming RF signal. The card then responds by modulating the incoming RF signal in such a way that the external RF receiver can interpret the code and thus uniquely identify the daughter card.

According to a further embodiment of the present invention, the daughter memory card is made in accordance with one of the existing card standards but with additional contacts added for connecting with the standard memory interface of the mother cards. This then allows the memory card to have a dual function: it can be used in the same manner as an existing card, directly with the host, or as a daughter card with one of the mother cards. As an illustration, contacts are added to the small Plug-in SIM card described above on the card's surface to surround the existing eight contacts that are provided as part of the ISO/IEC 7816 standard. The card may then be used in a host device in the same manner as the Plug-in SIN card, or as a memory daughter card when coupled with a mother card according to another one of the standards. For example, the contacts required for communication using ISO/IEC 7816 protocol may be used during powerup initialization to identify the card and allow authentication for access by the host or mother card to the data content of the card. This communication may then use the additional memory interface contacts at much higher speeds using the standardized communication protocol.

A patent application of Wallace et al., entitled "Use of Small Electronic Circuit Cards with Different Interfaces in an Electronic System" describes a combination of memories according to two different standards in a single memory card that shares a single set of card contacts. This application, Ser. No. 09/633,089, filed Aug. 4, 2000, is hereby incorporated herein by this reference.

According to yet another aspect of the present invention, provision is made for accommodating future changes to the daughter card memory when such changes may affect the manner in which the mother card controller or a host controller needs to operate. A dedicated portion of the daughter card memory space accessible to the mother card controller (but preferably not to the user) contains data of specific operating parameters of the memory. Once the daughter card is detected, the mother card controller reads these parameters upon initialization, or whenever a new daughter memory card is inserted into the mother card receptacle, and then configures itself to operate the card and its memory accordingly. The memory system operating parameters that may be set in this way include algorithms for writing data into the memory, reading data from the memory, erasing blocks of the memory, correcting errors in read data, and the creation of a file system. Other parameters include levels of voltages required by the daughter memory card, the size of memory cell blocks that are the minimum number of cells erased together, the size of pages of memory cells within the blocks that are programmed together and other aspects of large memory cell block management. The parameters chosen to be stored for controlling operation of the memory are those expected to change in the future as the memory technology evolves. Other parameters may include information about the security features for content protection, the unique daughter card identification number, information on how the mother card should handle multi-bit per cell storage on the daughter card, as well as whether the daughter card is operable as a "one time write", multiple write, read only, or non-memory functions such as applications for optimized operation of the daughter card in specific hosts. The mother card controller, and in some cases the host system to which the mother and daughter cards are connected, then adapt to the parameters stored in a connected daughter memory card.

Additional features, aspects and advantages of the present invention are included in the following description of exemplary embodiments, which description should be taken in conjunction with the accompanying drawings.

BRIEF DESCRIPTION OF THE DRAWINGS

FIG. 1 schematically illustrates specific examples of the use of a common daughter memory card with three different mother controller cards having incompatible specifications;

FIG. 2 is an electronic block diagram that shows the functions contained in a host device, a mother controller card and a daughter memory card;

FIG. 3 illustrates a storage card to which daughter memory cards are removably attached, and a reader having a slot in which the storage card may be inserted in order to read data from the memory cards attached to it;

FIG. 4 schematically illustrates an application of the daughter memory card, the storage card and the mother controller card for taking and storing data of photographs taken by a camera;

FIG. 5 schematically illustrates an application of the daughter memory card and the storage card, without use of the mother controller card, for taking and storing data of photographs taken by a camera;

FIG. 6A is a plan view of a specific example of a daughter memory card;

FIG. 6B is a cross-sectional view of the memory card of FIG. 6A, taken at section B-B thereof;

FIG. 7 shows one example of a receptacle within a mother controller card or a host device for receiving the memory card of FIGS. 6A and 6B;

FIG. 9 is a plan view of another example daughter memory card with surface contacts arranged differently than in the example of FIG. 6A;

FIG. 10 is a plan view of a lead frame that can be in the manufacturer of the card of FIG. 9;

FIG. 11C is a side view of the memory card of FIG. 11B;

FIG. 12A a plan view of a second specific example of the card shown in FIG. 9 that uses the lead frame of FIG. 10;

FIG. 12B is an end view of the memory card of FIG. 12A;

FIG. 12C is a side view of the memory card of FIG. 12B;

FIG. 13 is another example of a storage card with removably attached memory cards according to FIGS. 6A or 9, that is different than the storage card of FIG. 3; and FIG. 14 is a plan view of yet another memory card example.

DESCRIPTION OF EXEMPLARY EMBODIMENTS

Figure 8:
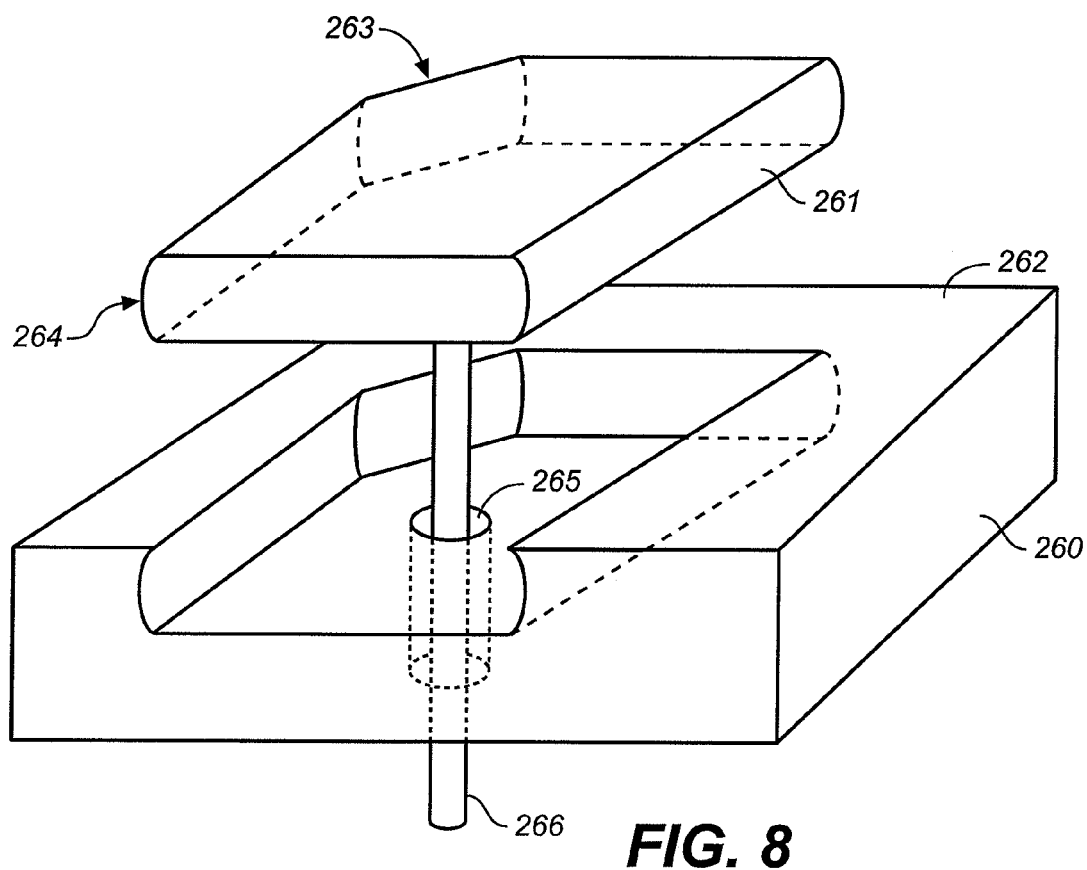
FIG. 8 shows example mounting details of a surface mounted daughter card of the type shown in FIGS. 6A and 6B.

FIG. 1 illustrates a common use of a daughter memory card 11 with three different mother cards 13, 14 and 15. The mother card 13 is designed to work with a host device 17 but not with host devices 18 or 19. As an example, the mother card 13 may have the same physical shape and host electronic interface as a CompactFlash™ card and the host 17 may be a digital camera. Similarly, the mother card 14 is designed to work with the host device 18 but not with host devices 17 or 19, and the mother card 15 is designed to work with the host device 19 but not with host devices 17 or 18, Also as examples, the mother card 14 may have the same physical shape and host electronic interface as either of the MMC™ or SD cards, and the host 18 may be a personal organizer. Further, the mother card 15 may have the same physical shape and host electronic interface as the Memory Stick™ card, and the host 19 may be a digital camcorder or any of a multitude of products currently offered for sale by Sony Corporation. A card slot 21 of the host 17 is physically shaped to accept insertion and removal of the mother card 13. A connector 22 of the mother card 13 mates with a matching connector within the card slot 21. Similarly, a card slot 23 of the host 18 accepts the mother card 14, and a card slot 25 of the host 19 accepts the mother card 15. A row of surface contacts 24 on the mother card 14 is contacted by a matching set of conductive elements of host card slot 23 (not shown) and a row of surface contacts 27 on the mother card 15 is contacted by a matching set of conductive elements of the host card slot 25.

The daughter memory card 11 is removeably received on each of the mother cards 13, 14 and 15 by some convenient electrical/mechanical arrangement thereon, shown to be in example positions 29, 30, and 31, respectively. Two rows of contacts 33 and 35 are shown on a surface of the memory card 11, as an example, for mating with a similarly arranged set of contacts within the mother cards 13, 14 and 15 when the memory card 11 is positioned thereon. Other contacting arrangements on the daughter card, such as a set of connecting surfaces on either or both flat surfaces, or contacts along one or more sides or edges, may be used. In the illustrated embodiment, each of the mother card 13, 14 and 15 substantially encloses the daughter card 11 but this is not required. A variety of methods to mate the cards may be used such as a slot, guide rail, or click-in-place mechanism. The daughter card may also include an indentation in a variety of shapes allowing removal with a narrow object such as a pencil point or nail, and it may also include a retention detent to ensure reliable contact. Alternatively, one or all of the mother cards 13, 14 and 15 may have provisions for retaining the memory card on its outside surface, such as by having a recessed surface region in the same shape as the memory card. In either of these examples, electrical contact is made with the memory card contacts 33 and 35 by appropriate electrical connectors within either the slot, recess or other physical memory card receptacle of each mother card. Many identical memory cards 11 will generally be used, one at a time, with any given mother card. Blank memory cards can be used in this way to store data from a host into which the mother card is inserted, or memory cards with data stored on them may be attached to a mother card for reading its data by a host into which the mother card is operably connected.

The mother card 13, in this example, has all the physical attributes and electrical host interface of a CompactFlash™ card, as well as a memory controller, but does not contain the mass non-volatile memory storage that is currently included in such a card. Rather, that mass memory is included in the daughter memory card 11 that is connectable with the mother card 13. Further, in this example, the mother card 14 corresponds to a MMC™/SD card with its mass memory removed and the receptacle 30 provided to receive the memory card 11 instead. Similarly, in this example, the mother card 15 corresponds to a Memory Stick™ card but with its mass memory removed and the receptacle 31 provided to receive the memory card 11 instead. Alternatively, other types of memory cards having the physical and electrical interface characteristics according to card standards other than CompactFlash™, MMC™/SD, and Memory Stick™, including those described above in the Background and others, may similarly be modified to remove their mass memory into the separate memory card 11.

The memory card 11 may have a capacity of 8, 16, 32, 64, 128 or more megabytes of non-volatile memory, for example of the flash EEPROM type, or of a onetime programmable memory that can be used for archival storage purposes. Indeed, memory cards of various capacities are expected to be sold to end users, so that only the amount of memory desired for a particular application need be purchased. The memory card is preferably plastic encased with electrical contacts of some convenient pattern across one or both surfaces of the card. The memory card 11 is preferably rectangular in shape with dimensions less than those of the present MMC™ or SD cards, an example being a card having substantially the same dimensions as the existing Plug-in SIM card.

The mother/daughter card combinations may be used with a variety of hosts. A host typically accepts one or perhaps two types of memory cards. Use of the memory card 11 separate from the mother cards that interface directly with various hosts therefore adds the convenience of being able to easily transfer data between two hosts that accept incompatible cards. For example, the card 11 can work with two cameras that are designed to save data of photographs into respective CompactFlash™ and Memory Stick™ cards that are accepted by the hosts' card slots. The daughter memory card 11 can then be moved between the two cameras. If the data format of individual photograph files saved by each camera is the same, for which an existing standard is predominate, a file stored on the memory card 11 by one camera may be read and processed by the other camera. The same easy transfer is also made possible when only one of two hosts is a camera and the other a utilization device, such as a personal computer, that processes or simply views photographs, but where the two do not have the same format card slot. In another example, the two hosts may be two types of audio devices with incompatible card slots. Other examples of uses of the daughter memory card 11 with multiple hosts that accept incompatible cards, as illustrated in FIG. 1, have already been discussed.

The separation of the memory card 11 from an existing card has uses beyond the transfer of data between incompatible mother cards. Even when only one host device is being used, or when two or more host devices have card slots according to a single standard, use of the separate memory card reduces the cost of storage for the user. A single mother card containing the host interface circuits and memory controller allows storage in a large number of less expensive memory cards 11. These memory cards may even be considered expendable and may be discarded after one or more uses, much like a consumable razor blade where the controller and host interface unit function analogous to a razor. The controller and host interface unit needs to be purchased only once for a given host device, in the form of a mother card, rather than having to purchase the unit as part of every memory card, as is currently the case with the memory cards discussed in the Background above.

The electronic functions of the host and cards are generally illustrated in FIG. 2. An individual host 41 includes a connector 43 to which a card interface circuit 45 and power circuit 47 are connected. The power circuit 47 provides the voltage(s) necessary to operate the cards connected with the host. The interface circuit 45 passes data and commands between the host and the cards with a particular protocol for a connected card. A mother card 49 includes a first connector 51 that physically and electrically mates with the host connector 43. Power received from the host, in addition to being used by the various circuits of the mother card 49, is received by a power circuit 53 that generates the voltages required to operate memory circuits within a memory daughter card 55. The mother card normally receives a low voltage from the host, such as 1.8 volts d.c., while memory arrays employed on daughter card 55 may over time employ different voltages and may require voltages higher or lower than those supplied by the host; even higher voltages may be required if the memory is a type that can be programmed more than once, such as a flash EEPROM. The power circuit 53 provides these voltages, usually by use of one or more charge pumps or voltage conversion circuits, to a connector 57 that mates with a connector 59 of the memory card 55. In this way the mother card can interface with daughter cards of different generations or of different memory technologies, possibly from different manufacturers, that may require different voltages. This requires that the daughter card provide to the mother card the necessary information for power circuits 53 to provide the appropriate voltages.

The mother card 49 also includes circuits 61 connected to the connector 51 to interface data and commands with the host. A programmable memory controller 63 is also included, often with a general-purpose microprocessor/microcontroller 65, to manage the memory within the card 55. The memory is provided within the card 55 by one or more integrated circuit memory chips 67. In order to minimize the cost of the daughter memory card 55, each such chip includes as few circuits as possible in addition to an array of memory storage cells. The physical and electrical interface at connector 57 is the same for all the different types of mother cards, so the programmable controller 63 is much the same. The physical and electrical interface at the mother card connector 51, on the other hand, is likely different for each type of mother card, as are the host interface circuits 61. The mother card interface follows a standard such as one of the existing standards described above in the Background. A number of such mother cards that satisfy different ones of the standards are contemplated.

As much of the memory control, addressing, programming, and reading circuits as practical are included within the mother card 49, rather than in the daughter memory card 55, in order to minimize the size and cost of the daughter memory card. Preferably, any circuits that work with the mother card microprocessor/microcontroller 65 to carry out memory controlling functions are included within the mother card 49. If a commercially available flash EEPROM integrated circuit chip 67 is used, some controlling functions are likely included in the memory chip such as state machine controlled programming, reading and erasing sequences. But the initiation and general control of such sequences are typically handled by the microprocessor/microcontroller 65 that executes firmware stored in a small code store (that can be ROM, SRAM, flash memory, or other code storing memory not shown) on the mother card. The daughter card may also contain all or part of this firmware (typically in a write protected area) and the microprocessor/microcontroller 65 may execute directly from this address space, or the firmware may be transferred from the daughter card 55 to a region of the code store on the mother card 49. Further, the microprocessor/microcontroller 65 preferably performs conversions of logical addresses received from the host into physical addresses within the memory chip 67, reassigns memory blocks such as may become necessary to avoid defective or overused blocks, performs background operations such as reprogramming to restore margins between memory states (scrubbing) and compaction of data pages stored in large blocks (garbage collection), and similar types of functions where some level of intelligence is required.

A suitable memory chip 67 is commercially available from SanDisk Corporation or other companies. An example is a 512 mega-bit flash memory chip such as described in the "512 Mbit NAND Flash Product Manual," revision 1.5, August 2001, available from SanDisk Corporation, which Manual is hereby incorporated herein by this reference. More than one such chip may be included in the daughter card 55. This memory chip is of a type allowing a large number of re-programming cycles in order to serve as computer mass storage in place of a conventional magnetic disk drive system. However, a less expensive flash EEPROM integrated circuit chip or other programmable memory chip such as mask ROM, one time programmable ROM, Ferroelectric RAM, Ovonic RAM, Polymeric RAM, Magnetoelectronic RAM, fuse RAM, or other forms of memory may be used instead if intended for an application requiring programming only once or just a few times. Such applications include the personal storage for archival or playback only of audio data, such as music, and video data, such as still photographs. If the daughter memory cards are made to be inexpensive enough, consumers can record such data once and then store the card away. The cost of a memory chip can be reduced when a large number of program/erase cycles are unnecessary. Such alternative memory chips can utilize either standard floating gates, dielectric layers, or programmable fuses as storage elements of its memory cells. It should be clear to the reader that the broad usage of different memory technologies and architectures in the daughter card inevitably will require different program/erase/read/file management/security algorithms and different voltage/power conditions for each of these different cards. Consequently the mother card must be able to supply such algorithms and operating conditions for the various daughter cards, and thus each daughter card must contain its specific and unique operating conditions and communicate these to the mother card upon request. This will advantageously be performed during initialization (boot-up) of the daughter card after it is inserted into and detected by the mother card.

It is also desirable to provide for the ability to use different forms of the memory chip 67 that may require the mother programmable controller card 49 to operate differently to control operation of the memory. Among the memory chip differences that may exist are binary (two-state) vs. multi-state (more than two state) cell operation, the memory cell erase block size, the amount of data that is programmed at one time, operating voltage(s) and algorithms for programming data, reading data, erasing blocks and performing error correction. If data stored on the daughter card are to be protected from copying, then specific algorithms for encryption or data protection may also be included together with their requirements for reserved blocks of memory. Data of such operating parameters may be stored in a portion of the memory chip(s) 67 that is not accessible to a host system but which is accessible by the memory controller 63. The memory controller of the mother card 49 then reads this operating parameter data from the memory chip(s) 67 upon initialization of the memory system and/or when a new memory card 55 is connected with the mother card 49. The read data then causes the memory controller to adapt to the operating parameters of the memory chip(s). This feature is also useful for allowing use of future improved or changed memory chips that may have such parameters changed.

During initialization it is a requirement that the memory controller 63 be able to communicate with the memory IC chip 67 at least to determine its operating parameters (voltage and communication protocol). Thus a standardized method of initial communication is defined, such as requiring all memory chips to communicate using at least one fixed voltage supplied by the power chip 53 and with a common signal format. For example, if all memory chips are required to communicate at 1.8 volts and subsequently identify that they need for example 3.0 volts (or 0.9 volt) for full operation, the mother controller card can then instruct its power unit to supply such voltage to facilitate further communication. Alternately, one or more dedicated pins may be included on the memory sub-card which the controller can interrogate to determine the required communication voltage range. After establishing initial communication, the other parameters required to transfer data may be determined. The MMC™ specification referenced previously describes one approach toward meeting these requirements.

A simplified approach for initialization is described in the following procedure. Upon application of power, the microprocessor or microcontroller on the mother card initializes itself and begins to monitor the card detect function described in detail below. Once a daughter card is detected, the mother card communicates with it using standardized protocol, timing, and voltage levels described above (for example, 1 MHz clock rates and 1.8 volt operation). A reserved sector located in a predefined location of the daughter card is then read which contains various other parameters needed for full operation of the daughter card. Such information includes the data format of the stored data (sector size and how to find the next sector), perhaps a file allocation table, maximum clock rates, unique card identification data (including security features), and information on required externally supplied voltages and timings and algorithms for write or erase. After the reserved sector is read and processed by the mother card, data communication between the mother and daughter cards can occur.

As mentioned earlier, some applications require restricted access to the content stored on the daughter memory card. This may be accomplished in a variety of ways. One approach using the ISO/IEC 7816 protocol is described below in conjunction with various embodiments in which the daughter memory card includes contacts to communicate using at least this protocol. Alternately, the daughter memory card may be designed to prevent transmission of data stored in certain predefined memory regions unless the mother memory card (or memory controller embedded in a host system) completes an authentication procedure to identify itself as authorized to access such data. Such protected data may include, for example, keys needed to decrypt content data stored in an otherwise accessible region of the memory card, or the ability to overwrite a lock protection feature restricting the ability of the memory card to accept new data or overwrite existing data.

Referring to FIG. 3, a storage card 71, about the size of a standard credit card, holds one or more daughter memory cards 11-1 through 11-5 in a manner that allows their easy removal and replacement, for the purpose of transport or storage of the memory card(s). The memory card(s) 11 may be positioned along one or more edges of the storage card 71. Although the card 71 is preferably made of thin, glossy plastic, like a standard credit card, a large surface area 73 adjacent the attached memory card 11 is coated with a material that accepts writing in pen or pencil. A user may then store a particular memory card 11 having a set of photographs, music or other data programmed thereon that is desired to be retained. The nature of the data can then be written by the user in the area 73. If a large number of memory chips are stored in this way, one memory chip per storage card, they may be organized and arranged, and desired data retrieved, by the information written into several areas 73 on each storage card.

As an example, the storage card 71 is rectangular in shape, with a length between 5 and 12 cm. and a width between 3 and 9 cm. It is preferable that the card be made thin but thick enough so that it is reasonably rigid, such as between 0.6 and 3 mm. in thickness. Exposed contacts 75 may optionally be included on a surface of the storage card 71 and connected to contacts 33 and 35 of memory cards 11-1 to 11-5 attached to it by conductors and connectors (not shown) that are formed as part of the storage card but this necessarily results in the card having a thickness sufficient to accommodate the conductive lines and additional insulation layers, as well as the respective connecting pins to each of the contacts on the daughter cards 11-1 to 11-5. A decoding integrated circuit (not shown) may also be included on storage card 71 to reduce the number of conductors while uniquely selecting one of several daughter cards 11-1 through 11-5. This allows data to be accessed on the several memory cards 11 without having to detach them from the storage card 71. A card reader 77, having a receptacle 79 for receiving the storage card 71, also includes the functions of the mother card 49 of FIG. 2. Contacts 81 of the card reader 77 correspond to the connector 57 of FIG. 2. The conductors of the other connector 51 are connected to a host utilization device 83, such as a personal computer. This allows, for example, the user to conveniently view photographs or listen to music stored on the several memory cards 11 by connection to a home computer without having to detach the memory card 11 from the storage card 71.

Alternately the storage card 71 may have embedded into it a controller chip that may provide the functionality of the mother card controller 49 of FIG. 2, so that it can directly communicate with each of the daughter cards 11. Such a storage card controller chip or dedicated circuits can also provide smart card security for accessing information on the daughter cards only by authorized users. It can also provide communication from the storage card by the ISO 7816 contactless or wireless protocol.

In the case where an embedded controller chip supports a suitable protocol for connecting to the utilization device 83, the storage card is acting as both a memory card controller and a reader. Although any one of a variety of communication protocols may be chosen, the USB protocol or IEEE 1394 ("Firewire") are particularly attractive for communication to a personal computer (PC). Other protocols such as ISO/IEC 7816, contactless, radio frequency wireless (such as BlueTooth or 802.11) may also be embedded in the storage card 71. In this case, the card reader 77 may be simply a mechanical adaptor and contain minimal or no active circuitry.

FIG. 4 illustrates handling of the memory card 11, when carried by the storage card 71, as the storage media for photographs taken by a digital camera 85. The camera 85 is of a type currently in widespread use that accepts Compact-Flash™ memory cards as the camera's "film." Therefore, the mother card 13 (FIG. 1) is used instead of the Compact-Flash™ card, along with the separate daughter memory card 11 that connects with the mother card 13. The sequence of events for loading the camera 85 with the memory card 11 are illustrated in FIG. 4 as follows: The memory card 11 is removed from its storage card 71 and inserted into the mother card 13, followed by inserting the mother card 13 into the camera 85 in the same manner as a CompactFlash™ card would normally be inserted. After data of photographs are stored on the memory card 11, the reverse takes place: The mother card 13 is removed from the camera 85, the memory card 11 then removed from the mother card 13 and the memory card 11 is returned to the storage card 71.

FIG. 5 illustrates another example use of the mother card, where the memory controller of the mother card is integrated as a permanent part of a different type of camera 87. In this case, the memory card 11 is removed from the storage card 71 and installed directly into the camera 87. After photographs have been taken, the memory card 11 is removed from the camera 87 and returned to the storage card 71. This system has the advantage of eliminating the need for mother cards but requires a digital camera to include the controller function before the memory card 11 can be used directly. Even without mother cards being necessary for using the memory card 11 with the camera 87, a mother card would be necessary for the memory card 11 to be used with other hosts that do not have the memory controller built in. It should be evident to the reader that although a camera is illustrated as the host which containing suitable circuitry to support the daughter card directly, other host devices are certainly possible such as cell phones or PDA's. In this case it may be desirable to record information created or downloaded by these hosts and transfer it to another host for later review or modification. Examples include music or other audio files (dictation, etc.), video images created by computer programs initiated by the user, or data downloaded by the host using the Internet.

A more detailed example of a daughter memory card is shown in FIGS. 6A (plan view) and 6B (cross-sectional view) that also includes the function of a security device. Physically, the outside of the card is made to be the same as the Plug-in SIM card discussed above in the Background. The electrical contacts (FIG. 6A) are arranged in an appropriate pattern across a surface of the card, one such pattern being illustrated by way of example. Contacts C1-C8 (121-129) follow the physical specification of the ISO/IEC 7816 standard discussed above in the Background. Contacts C1, C2, C3, C5, C6 and C7 are connected with a security integrated circuit chip 89 (FIG. 7) within the daughter card, while the standard leaves contacts C4 and C8 for future use. The chip 89 can be the same chip that is currently used in Plug-in SIM cards, such integrated circuit chips are available from Infinion, Hitachi, STMicroelectronics, or GemPlus. A necessary number of additional contacts 91-106 are added for connection to a mass memory integrated circuit chip 90 that is also included in the daughter card. The memory circuit chip 90 can be the 512 Mbit NAND chip mentioned above or other suitable commercially available chip. Multiple such chips (possibly stacked on each other) may be included in the daughter memory card. Certain ones of the contacts C1-C8 are multiplexed to also be used for the contacting pins of the memory chip. Contact C1, designated by the ISO/IEC 7816 standard to receive a supply voltage VCC, the contact C5, designated to be connected to ground, and the contact C6, to which a variable programming voltage is applied, can likely be used by both of the chips 89 and 90. The contacts C2 (reset signal), C3 (clock signal) and C7 (data input/output) can possibly be used by both chips. The contacts that can be used by both chips are connected within the card to both chips. Since the contacts C4 and C8 are not currently used for the security chip 89, they can be used for the memory chip 90. Other patterns of contacts are certainly possible so long as metal is positioned in the regions of the contacts C1-C3 and C5-C7 and connected with the security chip 89, if the card is to be compatible with the Plug-in SIM card standard.

Referring to the cross-sectional view of FIG. 6B, the daughter memory card includes a rigid substrate 109 to which the external contacts are attached. One side of chip 90 is attached to a top surface of the substrate 109 by an appropriate layer 111 of adhesive. The chip 89 is attached to an opposite side of the chip 90 by another layer 113 of adhesive. Wire leads are connected between pads of these chips to conductive traces (not shown) on the top surface of the substrate 109, which in turn are connected through conductive traces and vias (not shown) within the substrate to the contacts on the outside of the package. Pads on the two chips can be connected to at least some of the same outside contacts C1-C3 and C5-C7, such as the power contacts, that serve the same function for both chips. The package is completed by an appropriate resin or other encapsulant 115 that encases the two chips and the bonded wire leads. It should be clear to the reader that other methods of establishing electrical connectivity between one or both of chips 90 and 89 and the external contact surface of the daughter card are possible. For example, some or all the contacting pads may be placed on the top surface or top and bottom surfaces of substrate 109 or along one or two edges. For example, in FIG. 6B sample contacts 145 and 146 are shown on the opposite side of substrate 109.

FIG. 7 shows a base surface of a receptacle for the card of FIGS. 6A and 6B. When only the function of a Plug-in SIM card is to be used, only pins C1'-C3' (121'-122') and C5'-C7' (125'-127') are provided for contacting respective card contacts C1-C3 and C5-C7 when the card is placed contact side down on the surface of FIG. 8. The pins C1'-C3' and C5'-C7' are arranged in the same pattern as in existing receptacles for Plug-in SIM cards, such as found in cellular telephones. These 6 receptacle pins are then connected with the chip 89 according to the ISO/IEC 7816 standard. If connection with both of the chips 89 and 90 is desired, the full array of conductive pins are provided across the base surface of the receptacle. In either case, the receptacle bases of FIG. 7 may be positioned at the bottom of a slot in a mother controller card, or other devices, into which the card of FIGS. 6A and 6B is inserted by sliding across the receptacle surface from one side, or clicking into place by top-side insertion. Alternatively, the surface of FIG. 7 may be open from the top, in which case the card is dropped into it, followed by urging the card contacts against the receptacle pins by closing a cover over the card, or by providing other known holding mechanisms.

Another example daughter card receptacle is shown in FIG. 8. A daughter card 61 mates with an exposed surface 62 of the mother card or storage card 60. A suitable insertion guide is a chamfered corner 63 such that the cards can only mate in one orientation. A suitable rounded edge profile 64 is provided on the card 61 so that, when forcibly seated into the receptacle having mating curved sides, the cards are held securely together. A removal mechanism may include a hole 65 through the mother or storage card body through which a pencil or other pointed object 66 may be inserted to dislodge the daughter card 61 from the receptacle. Alternatively, an edge or corner of the daughter card may overhang the mother or storage card, thereby allowing the use of a finger or tool to dislodge the daughter memory card.

FIG. 9 shows a daughter memory card with an alternate contact arrangement. In this case all contacts are on one surface of the card allowing contact to a smaller receptacle inside the mother card, storage card, or reader. Although FIG. 9 shows the contacts positioned on one end (smaller edge), it will be understood that the contacts may also be positioned along the side (longer edge), or along the sidewalls of the daughter card.

Figure 11A:
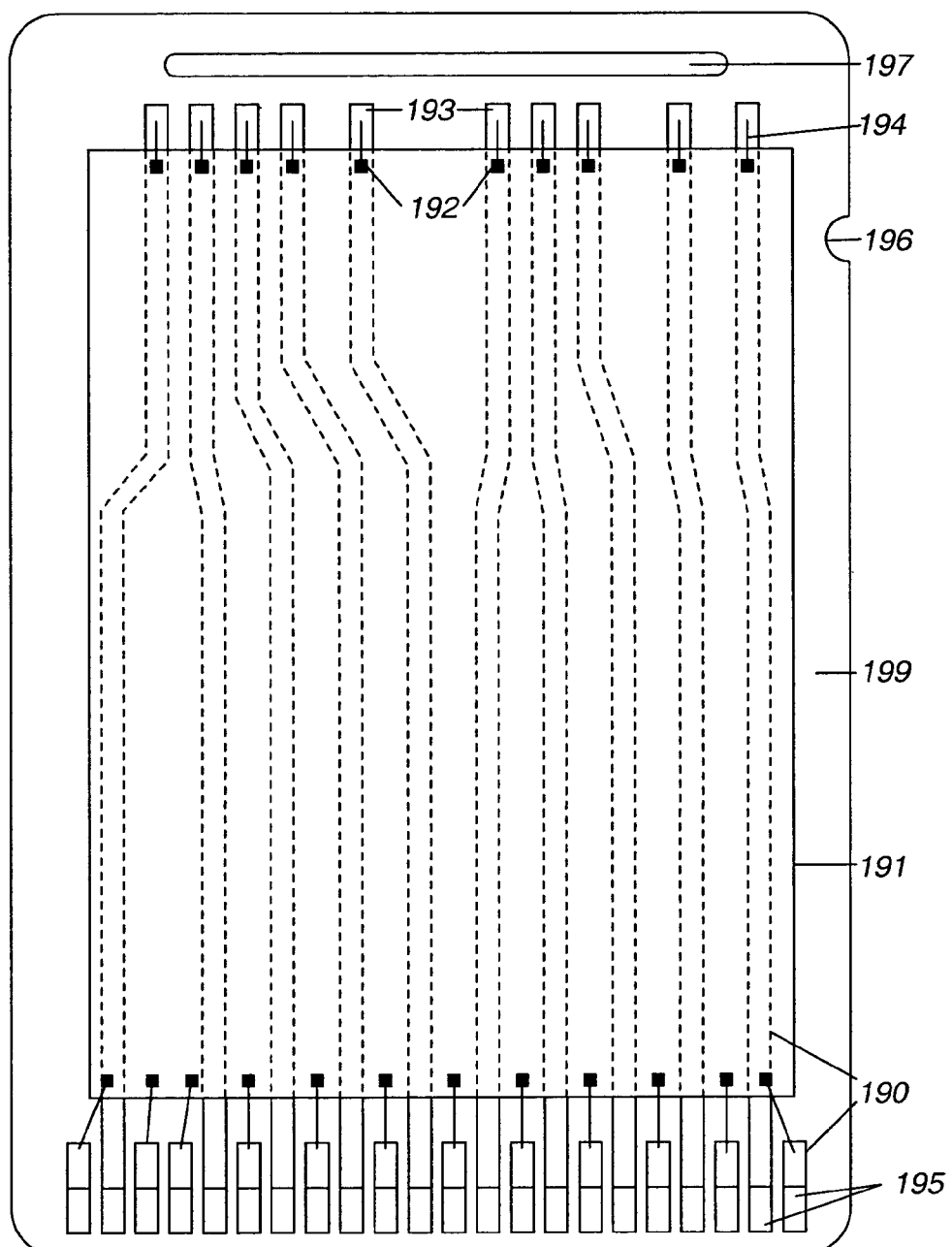
FIG. 11A is a plan view of a first specific example of the card shown in FIG. 9 that uses the lead frame of FIG. 10.
Figure 11B:
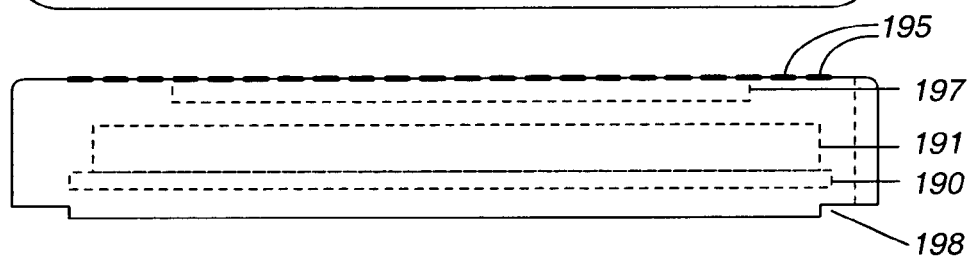
FIG. 11B is an end view of the memory card of FIG. 11A.

FIGS. 11A, 11B and 11C shows by dashed hidden lines a specific embodiment card of FIG. 9. The card is constructed from a metallic leadframe 190 shaped by stamping, etching, or various other techniques known to those skilled in the art into the pattern shown. FIG. 10 shows the starting metallic leadframe (metal is shown shaded), although several of these leadframes are commonly attached together in a strip as one solid piece of metal for economies of manufacturing. The memory die 191 is then attached to the leadframe using epoxy or similar adhesive material and leads are attached between pad openings on the die surface 192 to suitable pad regions 193 on the leadframe 190 using standard integrated circuit bonding techniques such as ultrasonic wire bonding 194 although other techniques such as plated bumps are certainly possible. The leadframe is then formed using standard techniques such that the external contacts 195 may be on a different plane than the interconnection portion of the leadframe. The card is then molded with a suitable encapsulate material 199 to mechanically protect the memory die 191 and the leadframe. The leadframe is cut along the trim lines 188 and 189 (FIG. 10) to electrically isolate the leads, either before the forming operation or after the molding operation, and the outer portions of the original leadframe are discarded, leaving the metal portions shown in FIGS. 11A-C.

The uniqueness of this leadframe design is that bonding pads on one or more sides of the memory die can be routed through the leadframe pattern to one or more different sides of the package, similar to a printed circuit board pattern. However, for this application the advantages of a leadframe over a printed circuit board include lower cost and reduced card thickness. The only wiring restriction is the inability to cross traces using only one level of leadframe interconnection, although this restriction is identical to that in common use today in matching any integrated circuit die into a suitable package; in practice die pad locations and package pin locations are considered together during the design phase of an integrated circuit. In prior art technology die are attached to a solid paddle region on the leadframe which prevents this wiring flexibility, but this embodiment allows more freedom in routing die interconnections from existing die to different package locations; specifically pads on two sides of a memory die may be routed to one edge of the daughter card. This routing flexibility occurs because the area under the memory die can be used for routing interconnections. The die is attached directly to and supported by (but electrically insulated from) the routing interconnections rather than a paddle area as is usually used. The leadframe 190 may then be formed using standard techniques to bring the daughter card interconnection pad locations 193 to a different vertical level than the bottom die surface (as shown in FIG. 11C), and then plastic molded in conventional fashion to encapsulate the die and leadframe, exposing only the card contact locations 195 of the leadframe which in this example are exposed only on the top surface along one edge of the daughter card similar to those shown in FIG. 9.

Another example card structure is shown in FIGS. 12A, 12B and 12C, which correspond to respective FIGS. 11A, 11B and 11C, wherein the same reference numbers are used for the same elements and reference numbers with a prime (') indicate additional elements corresponding to those identified by the reference number without the prime. The primary difference between the two cards is the attachment of a second memory or other integrated circuit die 191' to a side of the leadframe conductors opposite to the die 191. Wires 194' are attached between pads 192' of the memory die 191' and the underside of appropriate conductors 190 of the leadframe that may be in common with or separate from the leadframe conductors 190 to which wires 194 are attached on their top surfaces from pads 192 of the memory die 191. It is often desirable that the second die be functionally identical to the first die yet bond to substantially the same leadframe locations. This is commonly accomplished by changing one or more masks during wafer manufacture to alter the surface interconnection pattern from the internal circuitry to the bond pads resulting in a second die whose bond pads are in a mirror image location with respect to those on the first die. In this example bond pad 192A on the top die 191 is shown to bond to leadframe pad 193A and the corresponding pad on the bottom die 191' bonds to leadframe pad 193B. If these two pads perform an enable function for their respective chips 191 and 191', selecting only one of the two external contacts 195 of the leadframe conductors 193A and 193B will cause the other unselected die to both ignore all other inputs and disconnect its outputs, thus avoiding contention between the two die and allowing them to share common leadframe conductors and external card contacts 195. Security for access to the card can be provided by one of the die 191 or 191'. Security for access to the card can be provided by one of the die 191 or 191'.

In a practical implementation of a removable card there are certain mechanical details that become important such as ease of proper card insertion, detection of a properly seated card, securely retaining the card while inserted, and ease of card removal. These are addressed in the designs shown in FIGS. 11A-C and FIGS. 12A-C, where provision is made during the molding process for guide slots 198 in the daughter card matching guide bars on the mother card that work to assist the user in maintaining planarity during insertion and prevent insertion in a manner that would not make proper electrical contact. Once inserted, the mother card may contain a suitable spring loaded lock mechanism that matches a suitable detent 196 also formed during the molding process on the card and securely holds the daughter card inside the mother card ensuring continuous electrical contact. An ejection slot 197 may also be included on the daughter card for ease of removal. In this case an elongated slot is shown which can be utilized using a fingernail or other suitable mechanical object such as a pencil to overcome the spring loaded detent and eject the card. Alternatively, the card of FIGS. 11A-C may be given the curved edge shape of the card 61 in FIG. 8 for removably fitting into a receptacle of the mother and storage cards having mating edge shapes.

Detection of a properly inserted card is typically accomplished by the mother card using a variety of techniques. One approach is for the physical presence of a card to move a mechanical switch, opening a dedicated circuit causing an interrupt of the microprocessor or microcontroller on the mother card. Another approach to card detection is for the daughter card to contain a short between two otherwise insulating pins on the mother card interface connector such that current flows upon insertion. The card detection process then causes the mother card to initiate an initiation process to determine how to communicate with the daughter card.

An alternative to the storage card 71 of FIG. 3 is illustrated in FIG. 13. A storage card 151 has daughter memory cards 153 and 154 removably attached to it and an area 155 with a surface upon which the user may make a record 157 of the contents of the attached memory cards by handwriting with a pen or a pencil. The size of the storage card 151 is most conveniently that of a Smart Card (ID-1 SIM described above in the Background). The memory card 153 is most conveniently the size of the Plug-in SIM card and positioned on the surface of the storage card 151 according to Annex A of the GSM 11.11 specification previously discussed in the Background. The memory card 153 is attached to the storage card 151 with its surface contacts (not shown) facing outward. These contacts can have a pattern of those of the card of FIGS. 6A and 6B, FIG. 9 or some other pattern.

The memory card 153 can then be easily accessed while attached to the storage card 151. A card reader, such as that shown in FIG. 3, may include a receptacle that accepts the storage card 151 and with a mating pattern of elements to that of the contacts of the memory card 153 so that, when the storage card 151 is positioned in the card reader receptacle, an electrical connection is made directly with the memory card surface contacts. This is similar to a card reader for a Smart Card. The additional edge connector and internal wire traces of the card 71 (FIG. 3) are then unnecessary. Such a modified card reader is connected to a suitable utilization device 83 in place of the card reader 77.

FIG. 14 shows a variation of the memory card of FIGS. 6A and 6B. A set of 22 contacts of the FIG. 14 card corresponds to those of the card of FIGS. 6A and 6B, except that they are made shorter in order to increase the space between them so that another conductor 161 can be added to the card surface that extends along the length of the card. The 22 contacts can serve in the same manner as those of the card of FIGS. 6A and 6B. The added conductor 161 can be formed from the same layer of metal as the other 22 contacts. The conductor 161 provides, in this example, a radio frequency antenna. A transceiver analog circuit is included within the card and connected to this antenna. The card can then serve as a radio frequency identification (RFID) tag. The analog circuit may be integrated onto one of the chips 89 or 90 (FIG. 6B) within the card, or may be in the form of an additional integrated circuit chip.

The analog circuit receives its operating energy through the antenna 161 from a nearby external radio frequency (r.f.) source, typically one that is from 10 cm to 10 meters away, depending on the frequency used. A small amount of non-volatile memory within the analog circuit, typically for 128 bits of data, stores a user's unique key, a unique manufacturer's card number, or some other code. This data is read when the circuit is powered up by the external r.f. source, and then transmitted back through the antenna 161. An external r.f. receiver, which can be integrated with the r.f. transmitter, then reads the transmitted code. The flash memory and security chips within the memory package are not activated during this operation since the required voltage supply is not connected with the external contacts of the memory card.

One application of providing the RFID tag within a memory card is for theft protection. In a retail store, for example, a cashier can activate operation of this memory after payment for the memory card has been received from the customer, by storing a unique code or otherwise. Any inactivated card will trip an alarm when passing through a store exit equipped with the r.f. transmitter and receiver.

The analog circuit can also be used to enable operation of the flash memory within the same card only when the code memory is activated. Thus, a memory card not activated by the sales clerk at the point of sale will not operate. Further, the RFID tag feature can also be used as a limited form of protected storage for a user key as an alternative to use of the security chip 89 (FIG. 6B).

Another application is for inventory control of the memory cards. A unique code stored by the manufacturer can be used for this. Cards being received into inventory are passed by the r.f. transmitter and receiver to read this code, which is then stored in an inventory control database. When a card is removed from inventory, the code is again read and so noted in the inventory database.

Alternately, the RFID function may be incorporated into the storage card 71 of FIG. 3 containing an embedded controller. In this case the RF signal supplies both the desired data and a source of power to energize the embedded controller. The controller in turn can interrogate each of the attached memory daughter cards and determine if any of them satisfy the desired criteria. The result is that the desired data can be located from a collection of storage cards containing a collection of attached memory cards without inserting each storage card sequentially into a reader. This embodiment can be particularly useful when multiple daughter cards included in a card contain numerous images or numerous recorded songs and it is useful to an electronic photo album or a music library through the RFID function gating each of the daughter cards and electronically identifying which cards store photographs or songs.

Although the present invention has been described through exemplary embodiments thereof, it will be understood that the invention is entitled to protection the full scope of the appended claims.

The invention claimed is:

1. A system for connecting non-volatile memory to two or more host systems having distinct electronic and physical connections for removably receiving incompatible electronic cards, comprising:
   at least one non-volatile mass storage memory sub-card, and
   two or more electronic cards having incompatible electronic and physical interfaces adapted to connect respectively with said two or more host systems but individually including a receptacle that removably receives said at least one non-volatile memory sub-card and further individually including a controller connected to the receptacle for operating non-volatile memory within said at least one memory sub-card inserted into the receptacle to transfer data between the memory therein and a host to which the electronic card is connected.

2. The system of claim 1 wherein the two or more incompatible electronic cards include different ones of a PC Card, MultiMediaCard, Secure Digital card, CompactFlash card and Memory Stick card.

3. The system of claim 1 wherein the mass storage memory sub-card is shaped according to a Plug-in SIM card.

4. The system of claim 3 wherein the mass storage memory sub-card includes contacts and functions therethrough of the Plug-in SIM card plus an additional plurality of contacts connected with said memory therein.

5. The system of claim 4 wherein at least some of said contacts of the Plug-in SIM card are connected with said memory therein.

6. The system of claim 1 wherein operating parameters of the mass storage memory sub-card are stored in a protected area of the mass storage sub-card memory and the controller of said two or more electronic cards is provided access to the protected memory area of said sub-card connected thereto in order to ascertain the operating parameters, thereby enabling the controller to operate said sub-card.

7. The system of claim 6 wherein the operating parameters for said mass storage sub-cards have been stored permanently in said cards during their manufacture.

8. The system of claim 1 wherein said at least one mass storage memory sub-card includes a protected memory area that is accessible by the controller of an electronic card to which the sub-card is connected only upon authentication of the controller to the sub-card.

9. The system of claim 1 wherein said sub-cards contain a non-volatile memory selected from the group of EEPROM, Flash EEPROM, mask ROM, one time programmable EEPROM, EPROM, Ferroelectric RAM, Ovonic RAM, Magneto Ram, polymeric memory, dielectric memory, fuse ROM and antifuse ROM.

10. The system of claim 1 wherein said mass storage sub-card additionally includes a radio frequency antenna formed on a surface thereof and a radio frequency circuit within said sub-card connected with the antenna and responsive to radio frequency energy received thereby to provide power for transmitting a stored code in a radio frequency signal through the antenna.

11. The system of claim 10, wherein said stored code includes a unique identification number for each of said sub-card.

12. The system of claim 11, wherein said stored code further includes information describing the content stored on said sub-card.

13. The system of claim 1, wherein said at least one mass storage memory sub-card includes data stored of a unique identification number for each of said at least one mass storage memory sub-card.

14. The system of claim 13, wherein said at least one mass storage memory sub-card also includes data stored describing a data content of said at least one mass storage memory sub-card.

15. The system of claim 1, wherein the controllers within the electronic cards individually include a microprocessor.

16. A method of removably connecting a mass storage memory sub-card to two or more host systems that accept different ones of two or more incompatible electronic cards, comprising using a common mass storage memory sub-card that is removably connectable with said two or more incompatible electronic cards according to a common physical and electrical interface.

17. The method according to claim 16, additionally comprising using said two or more incompatible electronic cards with memory controllers therein that interface with the mass storage memory sub-card when connected therewith.

18. The method according to claim 16 wherein the two or more incompatible electronic cards include different ones of a PC Card, MultiMedia Card, Secure Digital card, CompactFlash card or Memory Stick card.

19. The method according to claim 16 wherein using the common memory sub-card includes using a card that is shaped the same as a Plug-in SIM card.

20. The method according to claim 19 wherein using the mass storage memory sub-card includes using a card having contacts and functions therethrough according to the Plug-in SIM card plus an additional plurality of contacts connected with said memory therein.

21. The method according to claim 20 wherein at least some of said contacts of the Plug-in SIM card are connected with said memory therein.

22. The method according to claim 16 wherein two or more of said common mass storage memory sub-cards may require different operating parameters, such parameters being communicated to said two or more incompatible electronic cards to enable said cards to adapt to the specific operating parameters provided by each sub-card.

23. The method according to claim of 22 wherein the operating parameters for said mass storage sub-cards are stored permanently in said cards during their manufacture.

24. The method according to claim 16, additionally comprising attaching one or more memory sub-cards to a substrate holder larger than said one or more memory sub-cards for storage when the one or more memory sub-cards are unconnected with any of the two or more incompatible electronic cards, and permitting the writing on the substrate holder adjacent the one or more memory sub-cards information describing the data content of the one or more memory sub-cards.

25. The method of claim 16, wherein the two or more incompatible electronic cards individually include a controller for causing data to be transferred into and out of the mass storage memory sub-card when connected therewith and for interfacing such data transfer with different hosts.

26. A memory system adapted to be removably connected with a host system, comprising:
an electronic card containing host interface circuits connected with a first connector adapted to be received by a receptacle of the host and a memory controller connected with a second connector, and
a mass storage sub-card having a third connector that mates with the second connector for removable connection to said electronic card, said mass storage sub-card containing memory partitioned into at least a first portion for storing user data from the host and a second portion not accessible to the host for storing data of operating parameters for the non-volatile memory to which the memory controller has access for controlling operation of said sub-card.

27. The memory system of claim 26 wherein the mass storage sub-card memory is partitioned to include a third portion that is accessible to the controller or host only upon authentication of the controller or host to the mass storage sub-card.

28. The memory system of claim 26 wherein the third connector includes a plurality of contacts positioned across a surface of the mass storage sub-card and connected with the memory therein.

29. A mass storage memory card, comprising:
at least one non-volatile memory integrated circuit chip encased in a card,
a radio frequency tag circuit also encased in the card, and
a plurality of electrically conductive contacts and a radio frequency metallic antenna formed across at least one outside surface of the card, at least some of the plurality of contacts being connected to said memory integrated circuit chip and said antenna being connected to said radio frequency tag circuit.

30. The memory card of claim 29 wherein the mass storage memory card has a physical shape and dimensions according to a Plug-in SIM card.

31. An electronic memory card system, comprising:
a plurality of electronic cards individually including a memory controller and having a physical shape, an arrangement of electrical contacts and an electrical signal interface through the contacts according to a different one of a plurality of published or proprietary card standards in order to be removably connected with a host system having a receptacle and a signal interface that are complimentary thereto, a mass storage sub-card of a given physical shape including a memory array connected with external contacts thereon in a given pattern, said plurality of electronic cards individually including a receptacle for removably receiving the mass storage sub-card and connecting the memory thereof with the memory controller of said electronic cards, whereby the sub-card is connectable with any of the plurality of electronic cards.

32. The electronic memory card system of claim 31, wherein the memory controller within the plurality of electronic cards controls the transfer of data into and out of the memory array within the mass storage sub-card when the sub-card is positioned in the receptacles of the plurality of electronic cards.

33. An electronic memory card system, comprising:

a first electronic card individually including a first memory controller substantially without mass data storage memory and having a physical shape, an arrangement of electrical contacts and an electrical signal interface for removable interconnection with a first host system, a second electronic card individually including a second memory controller substantially without mass data storage memory and having a physical shape, an arrangement of electrical contacts and an electrical signal interface for removable interconnection with a second host system, wherein the second electronic card does not interface with the first host system and the first electronic card does not interface with the second host system, a sub-card containing mass data storage memory, and a receptacle provided on each of the first and second electronic cards for removably receiving and operating said sub-card with a common electrical interface with the respective first and second controllers, whereby the sub-card may be interchanged between the first and second electronic cards.

34. The electronic memory card system of claim 33, wherein the first and second controllers each include a microprocessor.

35. An electronic card system, comprising:

a plurality of electronic cards individually including a host interface circuit and having a physical shape, an arrangement of electrical contacts and an electrical signal interface through the contacts according to different ones of a plurality of published or proprietary card standards, a mass storage memory sub-card having a physical shape, arrangement of a first set of electrical contacts and electrical signal interface through the first set of electrical contacts from a first electronic circuit within the sub-card according to one published or proprietary card standard other than said plurality of published or proprietary card standards, said sub-card including a second electronic circuit connected to at least some of the electrical contacts and to an additional second set of electrical contacts provided on the sub-card, and said plurality of electronic cards individually including a receptacle into which said sub-card is removably insertable, the receptacle having contacts that mate with the sub-card first and second sets of electrical contacts to connect with the electronic circuit within any of a plurality of the electronic cards, thereby to provide a functionality of the sub-card in a physical form and with an electrical interface according to individual ones of a plurality of published or proprietary card standards.

36. A method of removably connecting mass non-volatile memory storage to two or more host systems which accept different ones of two or more removable cards that are physically or electrically incompatible with each other, comprising:

connecting said two or more removable cards to the hosts, wherein the removable cards individually include a memory controller but not the mass non-volatile memory storage, and using a common sub-card which contains the mass non-volatile memory storage and that is removably connectable with said two or more cards according to a common physical and electrical interface in order to connect with the memory controllers therein.

37. A method of using at least first and second electronic cards which have electrical interfaces that are physically or electrically incompatible with each other and which are adapted to be removably connected with respective ones of at least first and second mating receptacles, comprising:

connecting, with said first and second mating receptacles, forms of the respective first and second electronic cards that individually contain a memory controller substantially without non-volatile mass data storage, wherein the memory controller is electrically connected with a socket into which a common card is removably connectable, wherein the common card contains non-volatile mass data storage accessible by the memory controller through the socket, and interchanging the common card between the sockets of the first and second electronic cards.

38. The method of claim 37 wherein the common card is smaller than either of the first and second electronic cards.

39. A method of providing a given electronic function according to any one of a plurality of published or proprietary card standards, comprising:

including the electronic function in a sub-card having a particular physical shape, an arrangement of contacts on the outside thereof and a given electrical interface with the internal electronic function through the contacts, providing at least first and second electronic cards having physical card shapes, arrangements of contacts and electrical signal interfaces according to respective first and second published or proprietary card standards that are incompatible with each other, said first and second electronic cards including a receptacle and set of electrical contacts that mate with said sub-card when removably placed in the receptacle and an electronic circuit that electrically interfaces with both the sub-card and the electrical signal interface of a published or proprietary card standard.

* * * * *